United States Patent
Takada

(10) Patent No.: US 8,077,241 B2
(45) Date of Patent: Dec. 13, 2011

(54) PHASE ADJUSTMENT METHOD AND DIGITAL CAMERA

(75) Inventor: Shinichi Takada, Osaka (JP)

(73) Assignee: Panasonic Corporation, Osaka (JP)

( * ) Notice: Subject to any disclaimer, the term of this patent is extended or adjusted under 35 U.S.C. 154(b) by 850 days.

(21) Appl. No.: 12/113,571

(22) Filed: May 1, 2008

(65) Prior Publication Data

US 2008/0278626 A1    Nov. 13, 2008

(30) Foreign Application Priority Data

May 8, 2007 (JP) ................................. 2007-123312

(51) Int. Cl.
*H04N 3/14* (2006.01)
*H04N 5/335* (2011.01)
(52) U.S. Cl. ...................................... 348/312
(58) Field of Classification Search ........................ None
See application file for complete search history.

(56) References Cited

U.S. PATENT DOCUMENTS

| | | | | |
|---|---|---|---|---|
| 6,583,818 B1 * | 6/2003 | Toma | ............................. | 348/312 |
| 6,678,408 B1 * | 1/2004 | Ruggiero et al. | ............. | 382/168 |
| 6,963,368 B1 * | 11/2005 | Shibazaki | ..................... | 348/241 |
| 7,796,176 B2 * | 9/2010 | Mimata et al. | ................. | 348/312 |
| 7,936,387 B2 * | 5/2011 | Morita et al. | .................. | 348/255 |
| 7,990,426 B2 * | 8/2011 | Tanaka et al. | ............... | 348/221.1 |
| 7,990,454 B2 * | 8/2011 | Notsu et al. | ..................... | 348/312 |
| 2008/0025598 A1 * | 1/2008 | Ogawa | .......................... | 382/162 |
| 2008/0174352 A1 * | 7/2008 | Miyakoshi et al. | ............. | 327/231 |
| 2008/0225141 A1 * | 9/2008 | Ogawa | .......................... | 348/251 |

FOREIGN PATENT DOCUMENTS

| | | |
|---|---|---|
| JP | 2003-018477 | 1/2003 |
| JP | 2003-18477 | 1/2003 |
| JP | 2005-142713 | 6/2005 |
| JP | 2005-151081 | 6/2005 |

OTHER PUBLICATIONS

Japanese Office Action, issued in Japanese Patent Application No. JP 2007-123312 dated Jun. 21, 2011.

* cited by examiner

*Primary Examiner* — Justin P Misleh
(74) *Attorney, Agent, or Firm* — McDermott Will & Emery LLP

(57) ABSTRACT

A signal change differential value detector detects a signal change differential value between two digital signals obtained when the analog imaging signal is converted into the digital value for each pixel using two phase adjustment sampling pulses. An analog imaging signal waveform estimator estimates a waveform of the analog imaging signal based on the signal change differential value. A timing adjuster calculates an optimal phase of the imaging pulse based on the waveform of the analog imaging signal estimated by the analog imaging signal waveform estimator.

16 Claims, 12 Drawing Sheets

F I G. 2
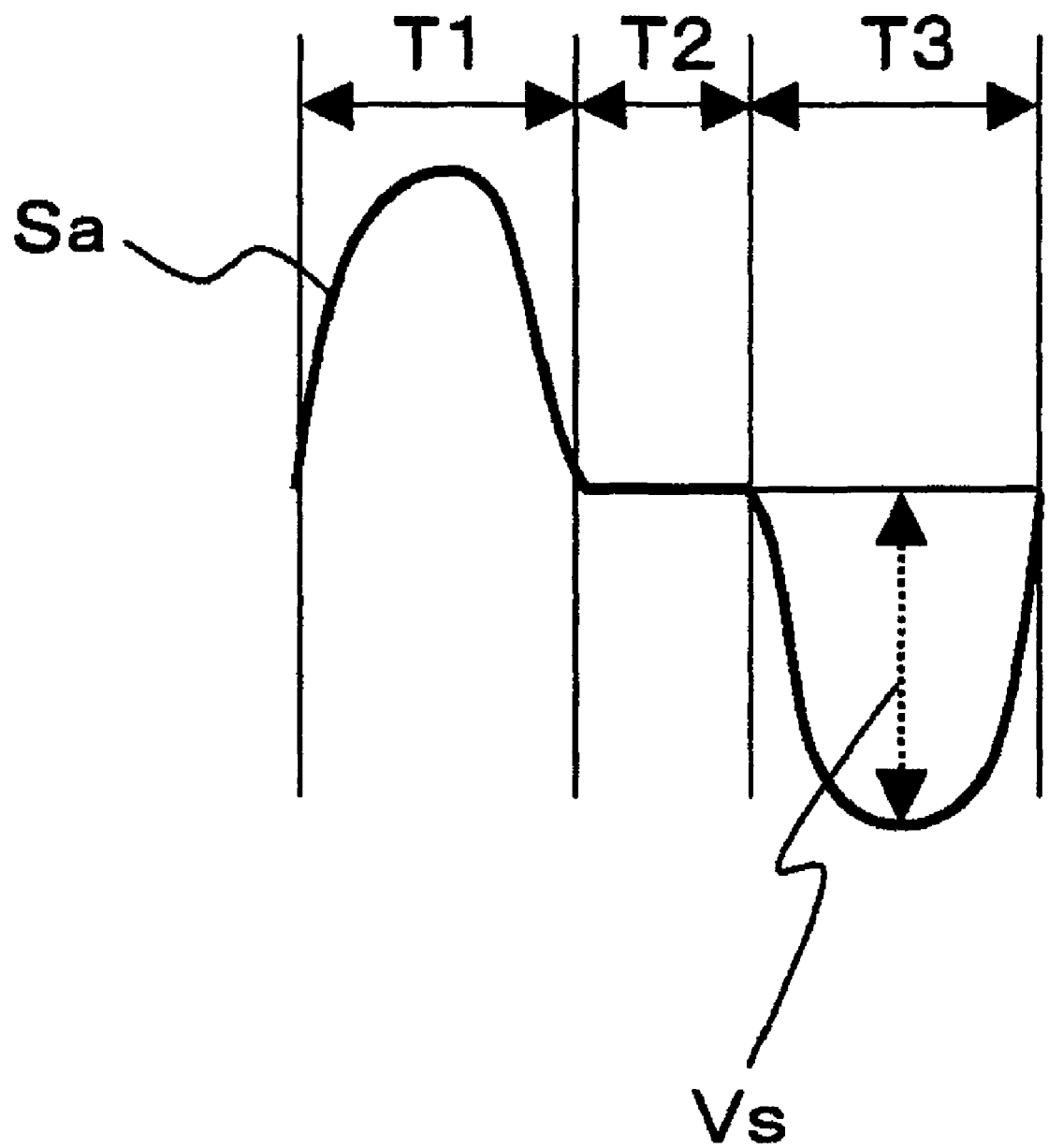

PHASE ADJUSTMENT METHOD AND DIGITAL CAMERA

BACKGROUND OF THE INVENTION

1. Field of the Invention

The present invention relates to a phase adjustment device and a phase adjustment method for adjusting a phase (timing) of a pulse used for obtaining an image in a digital camera, and a digital camera in which the phase adjustment device is incorporated.

2. Description of the Related Art

In a digital camera (digital still camera, digital video camera, mobile telephone provided with a camera, hospital-use camera, and the like), an analog imaging signal obtained by an imaging element such as CCD or an MOS sensor is converted into a digital imaging signal, and then, the digital imaging signal is recorded after being processed in a predetermined manner. In order to obtain an image of a photographic subject using the imaging element, a pulse for driving the imaging element, a pulse for detecting a signal level, and the like, are necessary, and it is difficult to adjust phases of these pulses in the hardware designing stage due to variability generated therein in the manufacturing process. Therefore, the phases are adjusted by an engineer after the manufacturing process, and information showing the adjusted phases is stored in a memory region and read from the memory region when the product is actually used so that the phases are optimally set.

There is a known conventional technology wherein only a noise element is fetched within a minimum exposure time, and the phase is adjusted under such a condition that a high-frequency component (noise element) is minimized. An example of the technology is recited in No. 2005-151081 of the Japanese Patent Applications Laid-Open. Hereinafter, the conventional example is referred to as the conventional example 1.

In view of the recycling of resources which has been actively promoted in recent years, a digital camera, which can be reused when only an exhausted imaging element is replaced, may be made available particularly in the field of hospital-use cameras used for an endoscope. However, the replacement of the imaging element naturally changes a system configuration, and the phase of the pulse for driving the imaging element accordingly becomes unsuited. As a result, it becomes necessary to readjust the phase of the pulse. When the phase is readjusted, it becomes necessary to minimize an amount of time required for the adjustment in order to improve a working efficiency.

There are a number of different pulses which are to be phase-adjusted. In the conventional example 1, wherein an optimal phase is calculated for all of the pulses by means of the same method regardless of characteristics of the respective pulses, the calculation of the optimal phase is time-consuming.

In another example of the method of calculating the optimal phase, the luminance and dispersion are calculated for each pixel in an inputted digital imaging signal, and the calculated luminance and dispersion are used to search the optimal phase of the pulse for the phase adjustment. However, the phase adjustment according to the relevant method is time-consuming because the optimal phase is individually calculated for each of the pulses.

SUMMARY OF THE INVENTION

Therefore, a main object of the present invention is to speedily and easily adjust a phase of a pulse for driving an imaging element.

In order to achieve the object, a phase adjustment device according to the present invention is a phase adjustment device for adjusting a phase of an imaging pulse used for imaging an analog imaging signal outputted by an imaging element based on a digital imaging signal obtained when the analog imaging signal is converted into a digital value for each pixel of the imaging element, comprising:

a signal change differential value detector for detecting a signal change differential value between two digital signals obtained when the analog imaging signal is converted into the digital value for each pixel using two phase adjustment sampling pulses;

an analog imaging signal waveform estimator for estimating a waveform of the analog imaging signal based on the signal change differential value; and a timing adjuster for calculating an optimal phase of the imaging pulse based on the waveform of the analog imaging signal estimated by the analog imaging signal waveform estimator.

In the present invention, the phase adjustment device according to the present invention preferably further comprises a signal change different value memory for memorizing the signal change differential value for each pixel detected by the signal change differential value detector, wherein the analog imaging signal waveform estimator reads the signal change differential value from the signal change differential value memory and estimates the waveform of the analog imaging signal.

In the present invention, the two phase adjustment sampling pulses are used to sample the analog imaging signal, and the digitalized digital imaging signal is inputted to the signal change differential value detector. The signal change differential value detector detects the signal change differential value between the two inputted digital imaging signals. The signal change differential value denotes a signal level difference of the analog imaging signal generated by a phase difference between the two adjustment sampling pulses. The signal change differential value is detected for each pixel, and each of the results thereby obtained is sequentially memorized in, for example, the signal change differential value memory. In a phase region where a signal value changing rate of the analog imaging signal (tilt) is larger, the signal change differential value is larger. In a phase region where the signal value changing rate of the analog imaging signal (tilt) is smaller, the signal change differential value is smaller. The analog imaging signal waveform estimator estimates the waveform of the analog imaging signal from the imaging element using chronological information relating to the signal change differential value. In other words, the analog imaging signal waveform estimator estimates that the phase region where the signal change differential value is large is a falling phase region in a reset period or a signal period of the analog imaging signal, while the analog imaging signal waveform estimator estimates that the phase region where the signal change differential value is small is a phase region in a reference period of the analog imaging signal. The information of the waveform of the analog imaging signal thus estimated by the analog imaging signal waveform estimator is given to the timing adjuster. The timing adjuster sets the optimal phase of the imaging pulse (reference sample pulse, peak sample pulse) in the estimated waveform of the analog imaging signal and gives an instruction to set the optimal phase to a timing generator or the like. The phase adjustment described so far is automatically implemented in the cooperative operations by the signal change differential value detector, analog imaging signal waveform estimator and timing adjuster. According to the constitution, the analog imaging signal waveform estimator actually estimates the waveform of the analog imaging signal obtained by the imaging element and calculates the optimal phase of the imaging pulse based on the status of the waveform of the analog imaging signal. Therefore, the phase adjustment of the imaging pulse can be very accurate, and the phase adjustment suitable for the current status of the imaging element can be thereby realized. Further, the respective pulses of the imaging pulses can be automatically adjusted, which can reduce an amount of time necessary for the adjustment in comparison to the phase adjustment in a manual operation by an engineer.

As described, the analog imaging signal is replaced with the signal change differential value so that the waveform of the analog imaging signal is estimated, and the optimal phase is calculated from the estimated waveform of the relevant analog imaging signal. Therefore, the phase can be adjusted in a manner similar to such an adjustment method that the phase can be adjusted based on the observation of the analog imaging signal by a measuring instrument such as an oscilloscope.

There is a different calculation method as follows. In the case of the analog imaging signal including a plurality of pixels, the luminance is detected for each of the pixels which are sequentially designated in a state where intervals of the phase shift are very small, and the optimal phase of the imaging pulse is calculated in computing processing based on the detected luminance. However, this method, which includes a large number of processing steps, is not suitable for high-speed processing.

In contrast, the optimal phase of the sampling pulse is calculated based on the status of the estimated waveform of the analog imaging signal in the present invention. Therefore, the number of the processing steps can be reduced, which realizes the high-speed processing.

In the present invention, the timing adjuster preferably calculates the optimal phase while shifting sampling phases of the two phase adjustment sampling pulses in a state where phase intervals in the two phase adjustment sampling pulses are fixed.

The fixation of the phase intervals in the two sampling pulses means that a very small change ($\Delta t$) in a temporal direction is always constant in the detection of the transition of the signal change differential value which shows the tilt of the analog imaging signal. The foregoing constitution is effective in order to assure the accuracy of the signal change differential value.

In the present invention, the timing adjuster preferably uses the two imaging pulses as the phase adjustment sampling pulses and uses the two imaging pulses in a state where they are phase-shifted.

In the foregoing constitution, the two imaging pulses used as the phase adjustment sampling pulses by the timing adjuster are preferably a peak sample pulse for detecting a level of the analog imaging signal and a reference sample pulse for detecting a signal level used as a reference level when the analog imaging signal is subjected to the correlated double sampling.

According to the foregoing constitution, the peak sample pulse and the reference sample pulse, which are to be phase-adjusted, are used for the calculation of the signal change differential value. Therefore, it becomes unnecessary to separately prepare a sampling pulse particularly used for the phase adjustment, which prevents a circuit configuration from being any further complicated.

In the present invention, the signal change differential value detector preferably continuously shifts the phases of the phase adjustment sampling pulses, and detects a first signal change differential value in a maximum value envelope of the analog imaging signal and a second signal change differential value in a minimum value envelope of the analog imaging signal for each of the shifted phases. In the constitution, the analog imaging signal waveform estimator preferably estimates a first falling portion in a reset period of the analog imaging signal, a reference period portion of the analog imaging signal and a second falling portion in a signal period of the analog imaging signal based on the first and second signal change differential values.

Outstanding large differential portions represent the first falling portion in the reset period and the second falling portion in the signal period. Because the outstanding large differential portion repeatedly appears in each pixel, it is not possible to distinguish which of the two outstanding large differential portions each representing the falling portion is the first falling portion and which is the second falling portion. Therefore, in order to distinguish between the first and second falling portions, the first signal change differential value in the maximum value envelope and the second signal change differential value in the minimum value envelope are used. A difference between the maximum value envelope and the minimum value envelope is always small during the reset period and the reference period, while the difference between the maximum value envelope and the minimum value envelope tends to be increased in each pixel during the signal period due to the characteristics of the analog imaging signal. A tilt of the first falling portion in the reset period is always relatively large in the waveform of the analog imaging signal. A tilt of the second falling portion in the signal period variously changes from pixel to pixel. Therefore, in the case where there are the first and second outstanding large differential portions, it is estimated that the signal waveform section of the outstanding large differential portion, in which a mountain shape obviously higher than in the phase region of the other outstanding large differential portion is formed (that is the first outstanding large differential portion), corresponds to the falling portion in the reset period. In the case where there is only one outstanding large differential portion, it is estimated that the signal waveform section of the outstanding large differential portion corresponds to the falling portion in the reset period.

In the present invention, the signal change differential value detector preferably detects the signal change differential value using an analog imaging signal including an analog imaging signal obtained from an OB region as the analog imaging signal. The signal change differential value in the minimum value envelope is always large in the falling portion in the reset period, while it variously changes in the falling portion in the signal period. Because a signal level of the analog imaging signal in the OB region shows a minimum level, the signal change differential value in the falling portion in the signal period is substantively zero, and the number of the outstanding large differential portions is consequently one in place of two. As a result, the outstanding large differential portion corresponds to the falling portion in the reset period.

In the present invention, the analog imaging signal waveform estimator preferably extracts from a first distribution region of the first signal change differential value for each phase a first outstanding large differential portion whose value is larger than in other portions in the first distribution region and a first stable small differential portion whose value is smaller than in other portions in the first distribution region, the analog imaging signal waveform estimator further extracting from a second distribution region of the second signal change differential value for each phase a second outstanding large differential portion whose value is larger than in other sections in the second distribution region and a second stable small differential portion whose value is smaller than in other sections in the second distribution region, and the analog imaging signal waveform estimator estimates that the first and second outstanding large differential portions are the falling phase region in the reset period of the analog imaging signal and the falling phase region in the signal period of the analog imaging signal, and estimates that the first and second stable small differential portions are the phase region in the reference period of the analog imaging signal. According to the constitution, the reset period and the reference period can be easily estimated.

In the present invention, the analog imaging signal waveform estimator preferably sets, as threshold values for extracting the first and second outstanding large differential portions and the first and second stable small differential portions, a first threshold value for distinguishing the first and second outstanding large differential portions from the other sections in the first and second distribution regions in which the value is smaller than in the first and second outstanding large differential portions and a second threshold value, being smaller than the first threshold value, for distinguishing the first and second stable small differential portions from the other sections in the first and second distribution regions in which the value is larger than in the first and second stable small differential portions so that criteria for extracting the first and second outstanding large differential portions and the first and second stable small differential portions can have hysteresis characteristics.

According to the foregoing constitution, any drastic variation (excessive vibration) of the signal change differential value can be absorbed. As a result, the reset period, reference period and signal period can be more accurately estimated based on the signal change differential value.

In the present invention, the analog imaging signal waveform estimator preferably further estimates a rising portion in the signal period by reversing the phases of the phase adjustment sampling pulses timewise, and the timing adjuster preferably calculates the optimal phase based on the second falling portion and the rising portion. When a temperature of a delay adjustment cell in the peak sample pulse is variable due to environmental changes after the adjustment, a sampling position is also variable, which results in the deterioration of the accuracy in the estimation of the optimal phase of the peak sample pulse. When the positional relationship between the phase adjustment sampling pulses is reversed timewise, the signal change differential value showing the rising portion of the analog imaging signal is effective in the phase adjustment according to the present invention. In other words, the signal change differential value is apparently shown in the waveform. The optimal phase of the peak sample pulse is set based on the stable small differential portion on a boundary between the second falling portion and the rising portion thus estimated. As a result, the optimal phase of the peak sample pulse can be more accurately set.

The phase adjustment device according to the present invention preferably further comprises a line counter, wherein the line counter gives an instruction on a target of the detection of the signal change differential value to the signal change differential value detector in units of a plurality of lines. According to the constitution, an amount of time necessary for the observation of the waveform of the analog imaging signal can be reduced in comparison to the detection of the signal change differential value by the line. As a result, the phase can be more speedily adjusted.

A digital camera according to the present invention comprises:

an imaging element for outputting an analog imaging signal;

a correlated double sampling unit for executing correlated double sampling to the analog imaging signal and deciding a signal level of the imaging element for each pixel;

an automatic gain controller for adjusting an amplitude of the analog imaging signal of which the signal level for each pixel is decided by the correlated double sampling unit;

an AD converter for generating a digital imaging signal from the analog imaging signal of which the signal level for each pixel is decided by the correlated double sampling unit and the amplitude is adjusted by the automatic gain controller;

a timing generator for generating an imaging pulse used for imaging the analog imaging signal; and the phase adjustment device according to the present invention for adjusting a phase of the imaging pulse based on the digital imaging signal.

The components of the digital camera according to the present invention (imaging element, correlated double sampling unit, automatic gain controller, AD converter, and timing generator), which are conventionally provided in the digital camera, do not need to be described in this specification. A key factor of the digital camera according to the present invention is that the phase adjustment device according to the present invention is provided therein.

A phase adjustment method according to the present invention is a phase adjustment method for adjusting a phase of a peak sample pulse for detecting a peak signal level of an analog imaging signal outputted from an imaging element and a phase of a reference sample pulse for detecting a signal level used as a reference level for executing correlated double sampling to the analog imaging signal, including:

a step of obtaining a digital imaging signal by sampling the analog imaging signal for each pixel of the imaging element while shifting sampling phases of the peak sample pulse and the reference sample pulse are in a state where phase intervals in the respective pulses are fixed;

a step of calculating a signal change differential value of the digital imaging signal;

a step of extracting a phase region where the signal change differential value is smaller than in other sections in a phase of the digital imaging signal and a phase region where the signal change differential value is larger than in the other sections in the phase;

a step of estimating a waveform of the analog imaging signal based on a result of the extraction in the extracting step; and a step of setting an optimal phase of the peak sample pulse and an optimal phase of the reference sample pulse based on the estimated waveform of the analog imaging signal.

In the phase adjustment method, the analog imaging signal is replaced with the signal change differential value so that the waveform of the analog imaging signal is estimated, and the optimal phase is calculated from the waveform of the analog imaging signal. Therefore, the number of the processing steps is reduced in comparison to such a method that calculates the optimal phase from the luminance detected for each pixel, which increases the processing speed. Further, the peak sample pulse and the reference sample pulse, which are to be phase-adjusted, are used as the phase adjustment sampling pulse for calculating the signal change differential value, which makes it unnecessary to prepare a sampling pulse particularly used for the phase adjustment. As a result, the circuit configuration can be prevented from being further complicated.

A phase adjustment method according to the present invention is a phase adjustment method for adjusting a phase of a peak sample pulse for detecting a peak signal level of an analog imaging signal outputted from an imaging element and a phase of a reference sample pulse for detecting a signal level used as a reference level for executing correlated double sampling to the analog imaging signal, including:

a step of obtaining a digital imaging signal by sampling the analog imaging signal for each pixel of the imaging element while shifting sampling phases of the peak sample pulse and the reference sample pulse in a state where phase intervals in the respective pulses are fixed;

a step of calculating a signal change differential value of the digital imaging signal;

a step of calculating a maximum value envelope of the signal change differential value and a minimum value envelope of the signal change differential value every time when the phase changes;

a step of extracting from a distribution region of the signal change differential value in the maximum value envelope a first outstanding large differential portion whose value is larger than in other portions in the first distribution region and a first stable small differential portion whose value is smaller than in the other portions in the first distribution region, the analog imaging signal waveform estimator further extracting from a second distribution region of the signal change differential value in the minimum value envelope a second outstanding large differential portion whose a value is larger than in other sections in the second distribution region and a second stable small differential portion whose a value is smaller than in the other sections in the second distribution region;

a step of estimating a first falling portion in a reset period of the analog imaging signal based on the first and second outstanding large differential portions;

a step of estimating a second falling portion in a signal period of the analog imaging signal based on the first and second outstanding large differential portions other than the first falling portion;

a step of estimating the first and second stable small differential portions present between the first and second falling portions in a reference period of the analog imaging signal;

a step of adjusting the phase of the reference sample pulse so that a rising edge of the reference sample pulse is as coincident with a middle point of the reference period as possible; and a step of adjusting the phase of the peak sample pulse so that a rising edge of the peak sample pulse is as coincident with a boundary between the second falling portion and the first and second stable small differential portions positioned immediately thereafter as possible.

In the phase adjustment method, the first falling portion in the reset period and the second falling portion in the signal period can be clearly distinguished from each other. As a result, the optimal phases of the reference sample pulse and the peak sample pulse can be very accurately detected.

A phase adjustment method according to the present invention is a phase adjustment method for adjusting a phase of a peak sample pulse for detecting a peak signal level of an analog imaging signal outputted from an imaging element and a phase of a reference sample pulse for detecting a signal level used as a reference level for executing correlated double sampling to the analog imaging signal, including:

a step of obtaining a first digital imaging signal by sampling the analog imaging signal for each pixel of the imaging element while shifting sampling phases of the peak sample pulse and the reference sample pulse in a state where phase intervals in the respective pulses are fixed;

a step of calculating a first signal change differential value of the first digital imaging signal;

a step of calculating a first maximum value envelope of the first signal change differential value and a first minimum value envelope of the first signal change differential value every time the phase changes;

a step of extracting from a first distribution region of the first signal change differential value in the first maximum value envelope a first outstanding large differential portion whose value is larger than in other portions in the first distribution region and a first stable small differential portion whose value is smaller than in the other portions in the first distribution region, the analog imaging signal waveform estimator further extracting from a second distribution region of the first signal change differential value in the first minimum value envelope a second outstanding large differential portion whose value is larger than in other sections in the second distribution region and a second stable small differential portion whose value is smaller than in the other sections in the second distribution region a step of estimating a first falling portion in the reset period of the analog imaging signal based on the first and second outstanding large differential portions;

a step of estimating a second falling portion in the signal period of the analog imaging signal based on the first and second outstanding large differential portions other than the first falling portion;

a step of estimating the first stable small differential portion positioned between the first and second falling portions in the reference period of the analog imaging signal;

a step of obtaining a second digital imaging signal by sampling the analog imaging signal for each pixel of the imaging element while shifting sampling phases of the peak sample pulse and the reference sample pulse in a state where the relationship between the phases of the peak sample pulse and the reference sample pulse is reversed timewise and phase intervals in the respective pulses are then fixed;

a step of calculating a second signal change differential value of the second digital imaging signal;

a step of calculating a second maximum value envelope of the second signal change differential value;

a step of extracting from a third distribution region of the second signal change differential value a third outstanding large differential portion whose a value is larger than in other sections of the third distribution region and a third stable small differential portion whose value is smaller than in the other sections of the third distribution region;

a step of estimating the third stable small differential portion positioned between the third outstanding large differential portion and the third outstanding large differential portion subsequent thereto in a period during which a pixel voltage shows its peak in the signal period;

a step of adjusting the phase of the reference sample pulse so that a rising edge of the reference sample pulse is as coincident with a middle point of the reference period as possible; and a step of adjusting the phase of the peak sample pulse so that a rising edge of the peak sample pulse is as coincident with a middle point of the pixel voltage peak period as possible.

According to the phase adjustment method, wherein the phase relationship between the peak sample pulse and the reference sample pulse is reversed timewise, the optimal phase of the peak sample pulse can be more accurately set.

According to the present invention, the waveform of the analog imaging signal obtained by the imaging element is actually estimated, and the optimal phase of the imaging pulse is calculated based on the status of the estimated waveform of the analog imaging signal. Therefore, the phase can be adjusted in response to the current status of the imaging element, and the phase adjustment can thereby achieves a higher accuracy. Further, the respective phases of the pulses are automatically adjusted, which results in the reduction of the amount of time necessary for the adjustment in comparison to the adjustment manually performed by the engineer.

Further, the analog imaging signal is replaced with the signal change differential value so that the waveform of the analog imaging signal is estimated, and the optimal phase is calculated from the estimated waveform of the relevant analog imaging signal. Therefore, the phase can be adjusted in a manner similar to such an adjustment method that the phase can be adjusted based on the observation of the analog imaging signal by a measuring instrument such as an oscilloscope. As a result, the number of the processing steps can be reduced in comparison to a method of calculating the optimal phase from the luminance detected for each pixel, which increases the processing speed. Further, the required components can be relatively simply constituted, and they can be realized as hardware components. This advantage can further increase the processing speed in the phase adjustment.

The present invention capable of automatically and speedily adjusting the timing of the pulse, which is used to obtain an image in a digital still camera or a hospital-use camera, can be advantageously used for at least the digital still camera and the hospital-use camera.

BRIEF DESCRIPTION OF THE DRAWINGS

These and other objects as well as advantages of the invention will become clear by the following description of preferred embodiments of the invention and be specified in the claims attached hereto. A number of benefits not recited in this specification will come to the attention of the skilled in the art upon the implementation of the present invention.

FIG. 2 chronologically shows a signal component outputted from an imaging element.

DETAILED DESCRIPTION OF THE INVENTION

Figure 1:
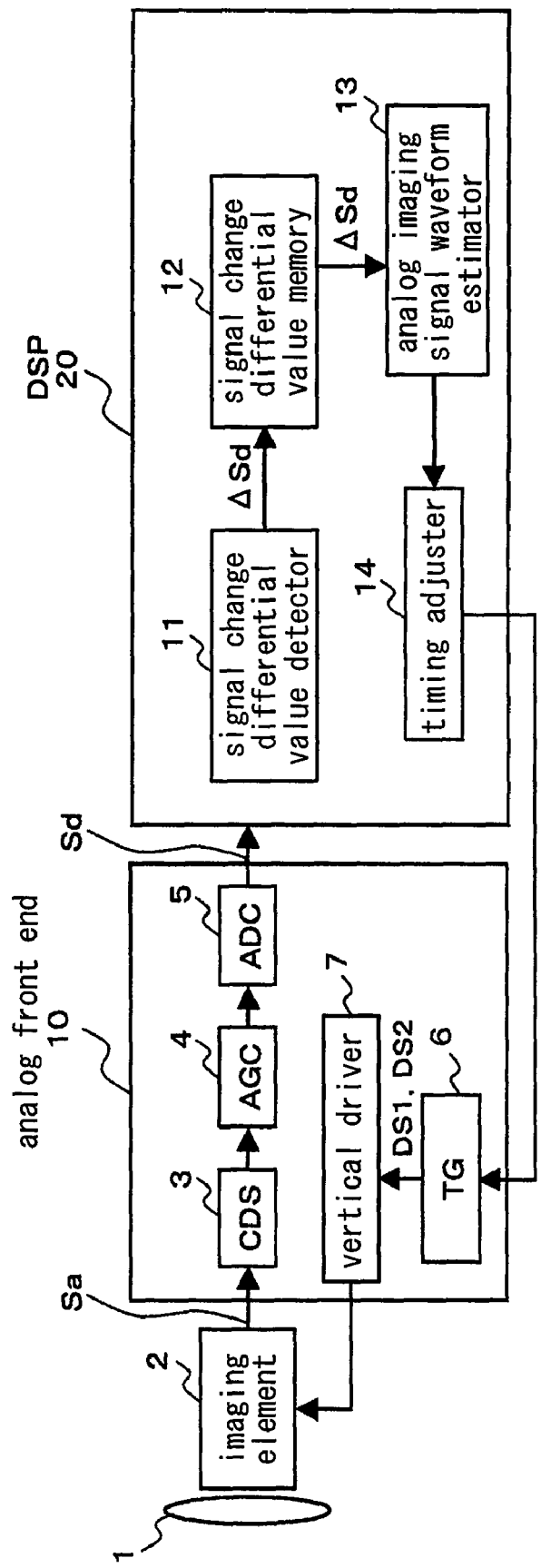
FIG. 1 is a block diagram illustrating an overall structure of a digital camera provided with a phase adjustment device according to a preferred embodiment 1 of the present invention.

Hereinafter, preferred embodiments of the present invention are described referring to the drawings.

Preferred Embodiment 1

FIG. 1 is a block diagram illustrating an overall constitution of a digital camera according to a preferred embodiment 1 of the present invention. The digital camera according to the present preferred embodiment comprises an optical lens 1 for converging an image of a photographic subject on an imaging element 2, the imaging element 2 for obtaining the image of the photographic subject converged thereon by the optical lens 1 (description is given below referring to CCD as an example of the imaging element 2), an analog front end 10 for providing predetermined processing to an analog imaging signal Sa outputted from the imaging element 2 and converting the resulting signal into a digital imaging signal Sd, and a DSP (Digital Signal Processor) 20 for generating a video signal by providing predetermined processing (color correction, YC processing and the like) to the digital imaging signal Sd outputted from the analog front end 10.

The imaging element 2 includes a plurality of pixels, and the plurality of pixels each comprise an effective pixel region used for obtaining the image of the photographic subject, and an OB pixel region provided in a periphery of the effective pixel region in a light-blocking manner and used for detection of the OB (Optical Black) level.

The analog front end 10 comprises a correlated double sampling (CDS) unit 3 for executing the CDS in order to identify a signal level of the analog imaging signal Sa outputted from the imaging element 2, an automatic gain controller (AGC) 4 for amplifying the signal outputted from the correlated double sampling unit 3 using an adjustable gain, an AD converter (Analog Digital Converter) 5 for converting the signal amplified by the automatic gain controller 4 into the digital imaging signal Sd, a timing generator 6 for generating a pulse used when the image is obtained, and a vertical driver 7 for outputting the pulse generated by the timing generator 6 to the imaging element 2.

The DSP 20 comprises a signal change differential value detector 11, a signal change differential value memory 12, an analog imaging signal waveform estimator 13, and a timing adjuster 14. The signal change differential value detector 11 detects a signal change differential value ΔSdn (see FIG. 5) and a signal change differential value ΔSdx (see FIG. 6) for each shift phase of two sampling pulses. The signal change differential value ΔSdn denotes a signal change differential value in a minimum value envelope Sdn of digital data, while the signal change differential value ΔSdx denotes a signal change differential value in a maximum value envelope Sdx of the digital data. The digital data mentioned in this description is data obtained when the analog signal Sa is converted by the AD converter 5.

The signal change differential value memory 12 memorizes the signal change differential value ΔSdn and the signal change differential value ΔSdx detected by the signal change differential value detector 11 for each phase of the pulse generated by the timing generator 6. The analog imaging signal waveform estimator 13 estimates a waveform of the analog imaging signal Sa outputted from the imaging element 2 based on the contents memorize in the signal change differential value memory 12. The timing adjuster 14 calculates optimal phases of a reference sample pulse DS1 and a peak sample pulse DS2 in the waveform of the analog imaging signal Sa estimated by the analog imaging signal waveform estimator 13, and phase-adjusts (timing-adjusts) the timing generator 6 so that the optimal phases are obtained.

FIG. 2 chronologically shows the analog imaging signal Sa outputted from the imaging element 2. As shown in FIG. 2, a reset period T1, a reference period T2 and a signal period T3 constitute the analog imaging signal Sa. The reset period T1 is a period used for resetting the imaging element 2. The reference period T2 is a period during which a reference voltage is outputted from the imaging element 2, and is also a period during which a signal used as a reference in the operation of the correlated double sampling unit 3 is detected. The signal period T3 is a period during which a signal voltage is outputted. The signal voltage which shows a peak level in the signal period T3 and a reference voltage in the reference period T2 are sampled so that a differential voltage between the two voltages is obtained. As a result, a signal level Vs of the analog imaging signal Sa can be obtained. In FIG. 2, the downward direction therein is defined as a forward direction of a signal component.

Figure 3:
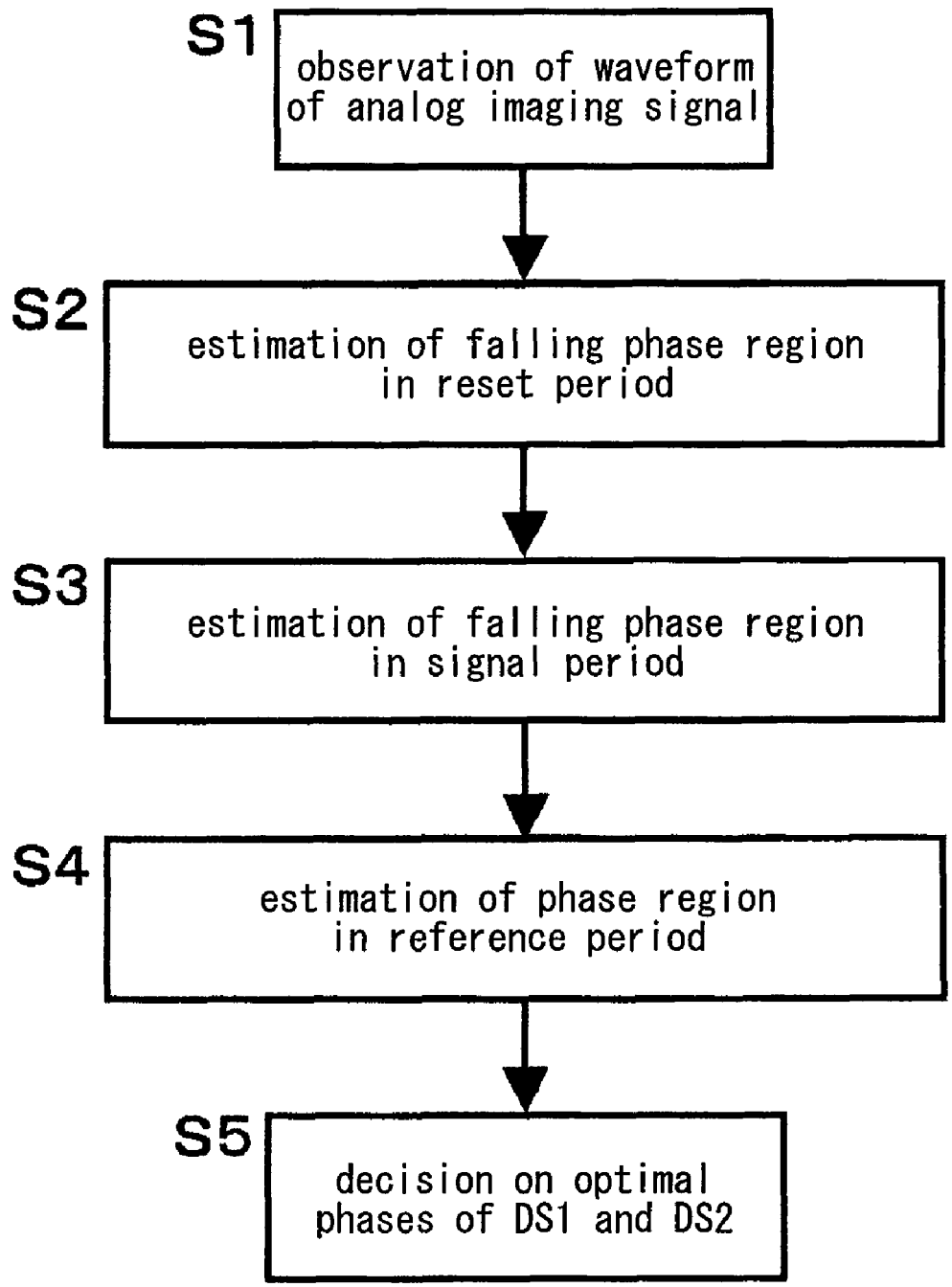
FIG. 3 is a flow chart illustrating phase adjustment operations according to the preferred embodiment 1.

FIG. 3 shows a general flow of adjustment of the respective pulses according to the present preferred embodiment. The phase adjustment is carried out mainly by the signal change differential value detector 11, signal change differential value memory 12, analog imaging signal waveform estimator 13, and timing adjuster 14. In the present preferred embodiment, the reference sample pulse DS1 and the peak sample pulse DS2 are targeted for the phase adjustment. The reference sample pulse DS1 is a pulse used for sampling the signal component which is used as a reference in the correlated double sampling. The reference sample pulse DS1 is desirably phase-adjusted so that a rising edge thereof is coincident with a middle point of the reference period T2. The peak sample pulse DS2 is a pulse for sampling the signal component which shows its peak in the signal period T3. The peak sample pulse DS2 is desirably phase-adjusted so that a rising edge thereof is coincident with a time point when the analog imaging signal Sa outputted from the imaging element 2 shows its peak. The signal level Vs calculated by the correlated double sampling unit 3 denotes a differential between the peak signal component in the rise of the peak sample pulse DS2 and the signal component within the reference period T2 determined by the rise of the reference sample pulse DS1, and the signal change differential value ΔSd thereof shows a signal level of the pixel.

The reference sample pulse DS1 and the peak sample pulse DS2 are not used for the original purpose described above. The reference sample pulse DS1 and the peak sample pulse DS2 become necessary when the signal change differential value ΔSdn in the minimum value envelope Sdn and the signal change differential value ΔSdx in the maximum value envelope Sdx are detected from the analog imaging signal Sa in the phase adjustment. The reference sample pulse DS1 and the peak sample pulse DS2 are utilized as two sample pulses for the phase adjustment used in a state where the phase intervals are fixed. More specifically, a differential between the signal component sampled in the reference sample pulse DS1 and the signal component sampled in the peak sample pulse DS2 is regarded as a tilt of the signal component during a certain period in the present preferred embodiment.

Figure 4:
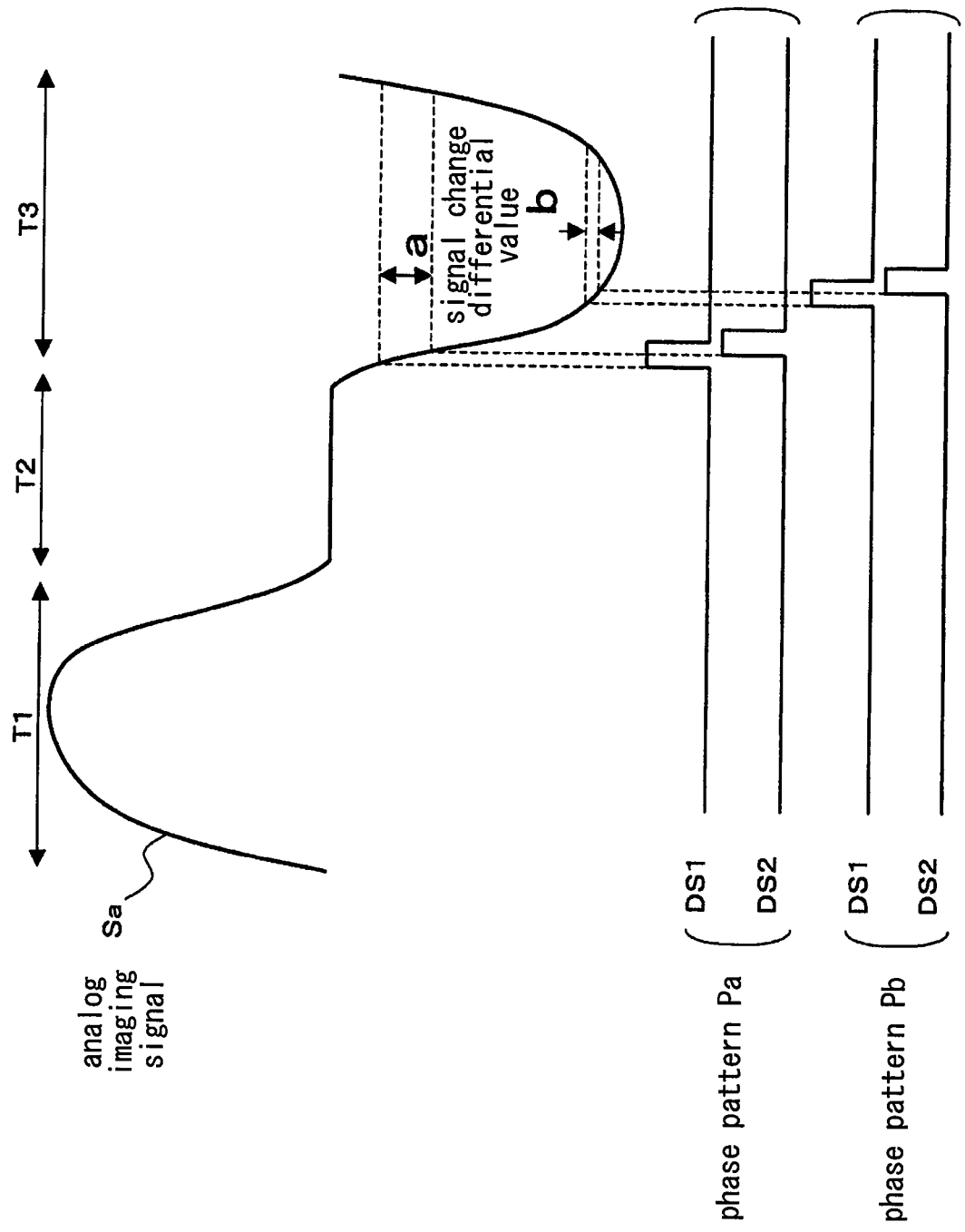
FIG. 4 is a correlation diagram of signal component differences and a waveform tilt according to the preferred embodiment 1.

A detailed description is given referring to FIG. 4. Below is assumed the case where a pair of the reference sample pulse DS1 and the peak sample pulse DS2 are sampled in a phase pattern Pa and a phase pattern Pb. In the assumed case, the signal change differential value in the case of the sampling in the phase pattern Pa is a, while the signal change differential value in the case of the sampling in the phase pattern Pb is b. It is also assumed that the phase intervals between the reference sample pulse DS1 and the peak sample pulse DS2 are the same in the phase patterns Pa and Pb.

As is clear from FIG. 4, the signal change differential value a is larger than the signal change differential value b. Because the phase intervals in the reference sample pulse DS1 and the peak sample pulse DS2 are the same in both the patterns, the tilt of the signal waveform at the time when the signal change differential value a is obtained is steeper than that of the signal waveform at the time when the signal change differential value b is obtained. It means that the tilt is steep when the signal change differential value is large, while the tilt is moderate when the signal change differential value is small.

Based on the foregoing aspect, the tilt in the signal outputted from the imaging element 2 (the tilt as used here means the tilt of a waveform described above) is calculated in a time-dividing manner while the phases are being shifted from initial values in the state where the phase intervals between the reference sample pulse DS1 and the peak sample pulse DS2 are fixed. The signal waveform is estimated based on a result of the calculation of the tilt, and the optimal phases of the reference sample pulse DS1 and the peak sample pulse DS2 are calculated from a result of the estimation of the waveform.

Below is described the method of calculating the optimal phase referring to the flow chart shown in FIG. 3. First, the tilt of the analog imaging signal Sa outputted from the imaging element 2 is calculated in the time-dividing manner, and a shape of the waveform of the analog imaging signal Sa is observed (Step S1). Next, a falling portion of the signal waveform in the reset period T1 is estimated from the data of the observed waveform shape (Step S2). In a similar manner, the falling portion of the signal waveform in the signal period T3 is estimated from the data of the observed waveform shape (Step S3), In a similar manner, the falling portion of the signal waveform in the reference period T2 is estimated from the data of the observed waveform shape (Step S4). Then, the optimal phase of the reference sample pulse DS1 and the optimal phase of the peak sample pulse DS2 are decided based on estimation results thereby obtained in Steps S2, S3 and S4 (Step S5).

When the optimal phase of the reference sample pulse DS1 and the optimal phase of the peak sample pulse DS2 are decided, the information relating to the decided optimal phases is set in a register in the timing generator 6. Accordingly, the reference sample pulse DS1 and the peak sample pulse DS2 each having the optimal phase are generated.

Next, details of the respective steps are described.

1) Step S1: Observation of Waveform of Analog Imaging Signal Sa

When the signal waveform is observed in this step, the phase intervals in the reference sample pulse DS1 and the peak sample pulse DS2 are kept fixed, and the phase of each of the pulse DS1 and DS2 is shifted from the initial value coincidentally in a state where the phase of the reference sample pulse DS1 is advanced timewise in comparison to that of the peak sample pulse DS2. In the present preferred embodiment, the phase is shifted every time of the entire region in effective pixel regions of the imaging element 2 and OB pixel regions used for the estimation regarding the reset period T1 described later are read. When the image is displayed on a monitor as a moving image, the image data is previously thinned from the imaging element 2 by the line and then outputted. Therefore, the output of the thinned image data is also to be sampled.

The data which was subjected to sampling is converted into the digital imaging signal Sd by the AD converter 5 and supplied to the signal change differential value detector 11. The signal change differential value detector 11 detects the signal change differential value ΔSdn in the minimum value envelope Sdn (see FIG. 5) and the signal change differential value ΔSdx in the maximum value envelope Sdx (see FIG. 6) of the supplied sampling data on a phase-by-phase basis, and stores the detection results in the signal change differential value memory 12.

Figure 5:
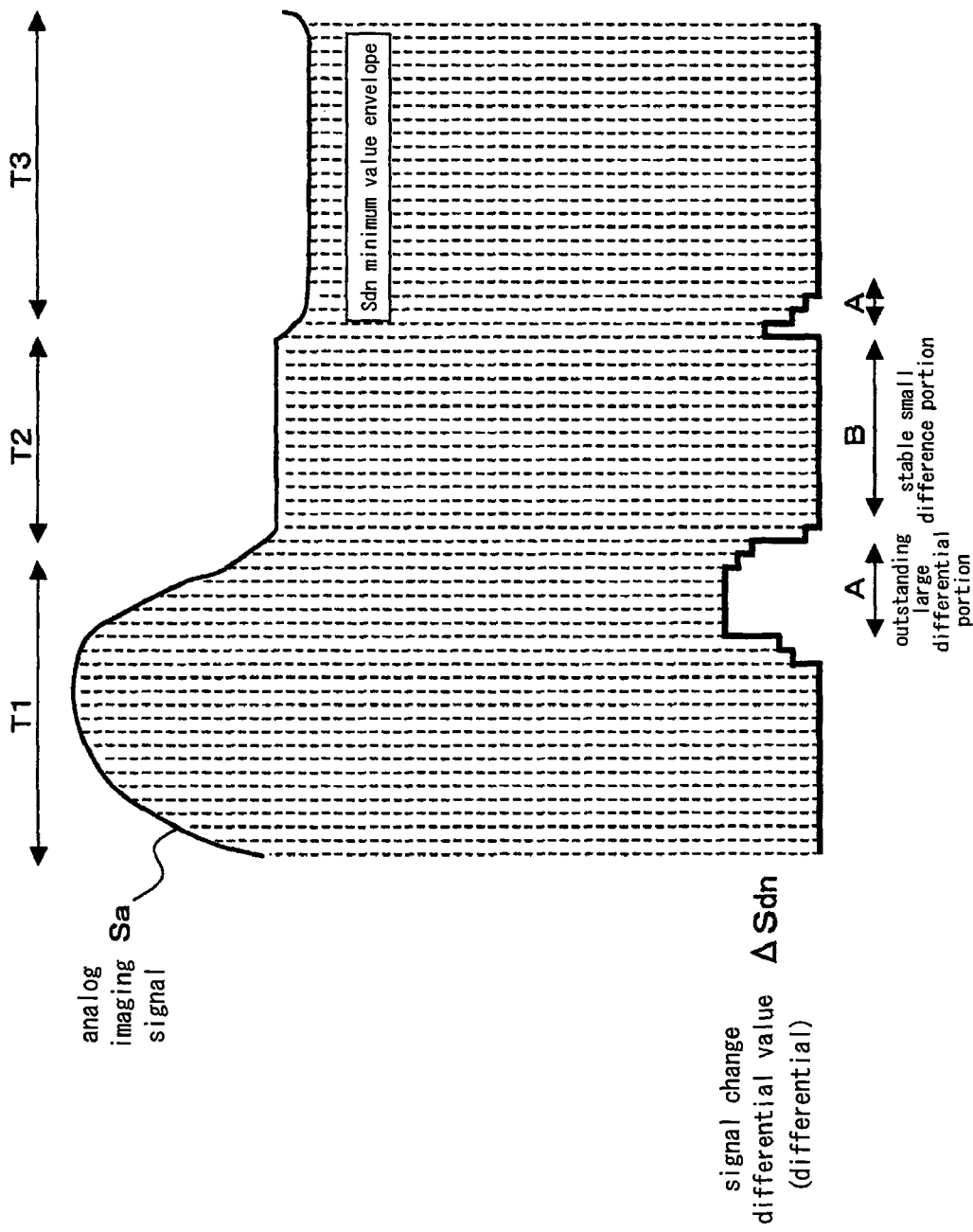
FIG. 5 shows a relationship between the chronologically-shown signal component outputted from the imaging element and a waveform of a signal change differential value in a minimum value envelope according to the preferred embodiment 1.
Figure 6:
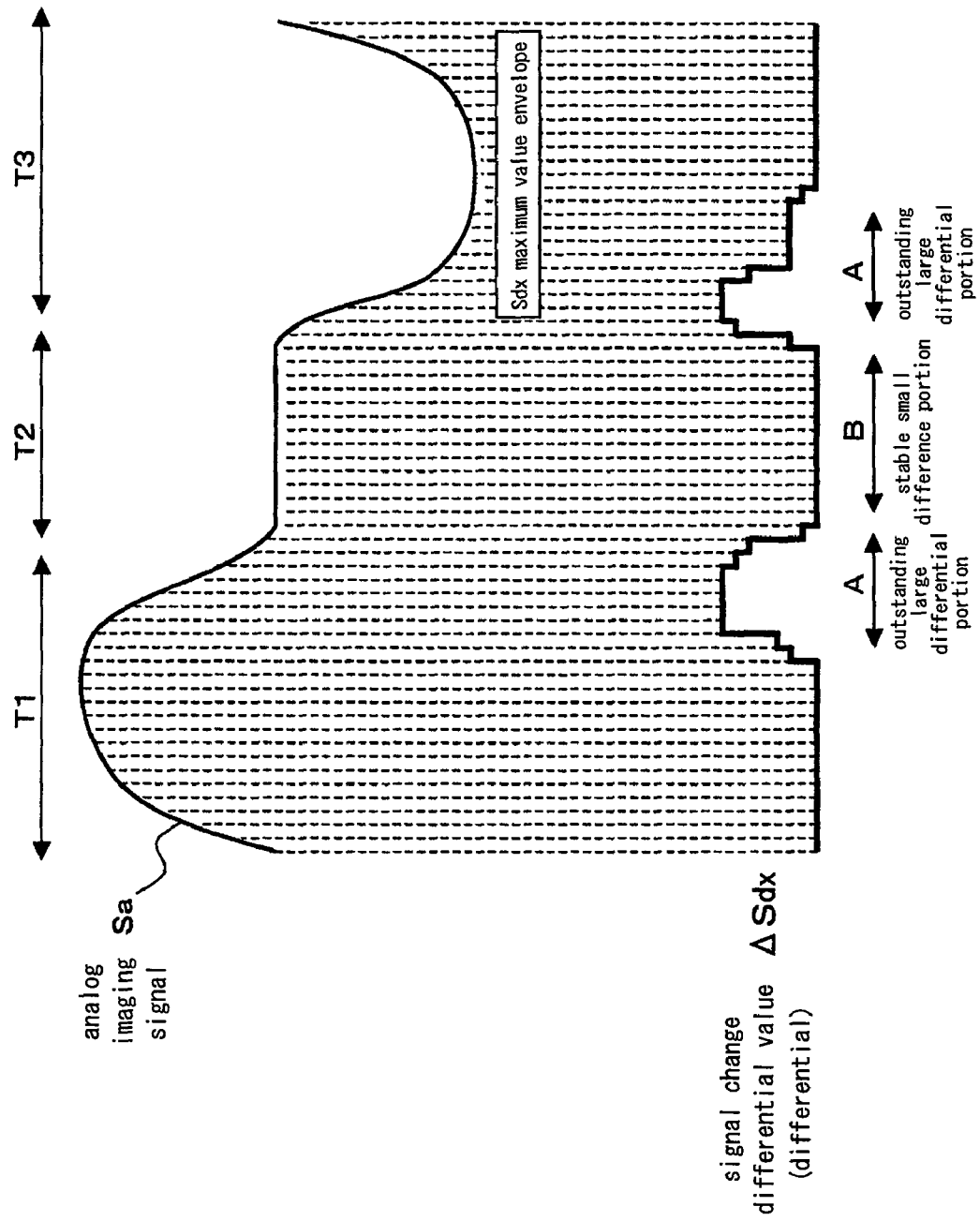
FIG. 6 shows a relationship between the chronologically-shown signal component outputted from the imaging element and a waveform of a signal change differential value in a maximum value envelope according to the preferred embodiment 1.

FIG. 5 shows the signal change differential value ΔSdn in the minimum value envelope Sdn memorized in the signal change differential value memory 12 in a chronological manner in comparison to the analog imaging signal Sa outputted from the imaging element 2. FIG. 6 shows the signal change differential value ΔSdx in the maximum value envelope Sdx memorized in the signal difference change value memory 12 in a chronological manner in comparison to the analog imaging signal Sa outputted from the imaging element 2. The intervals shown by doted lines in the drawings are sampling intervals in the reference sample pulse DS1 and the peak sample pulse DS2, and the sampling interval corresponds to the phase interval used when the differential is calculated. A differential waveform denotes a differential value between a sample value obtained when sampled with the reference sample pulse DS1 and a sample value obtained when sampled with the peak sample pulse DS2, and the differential waveform is memorized in the signal change differential value memory 12.

As learnt from FIGS. 5 and 6, the signal change differential value ΔSd is large where the tilt is large, while the signal change differential value ΔSd is small where the tilt is small. However, in order to draw this conclusion, for the correlated double sampling unit 4 should meet the condition in terms of its constitution that a potential obtained when the signal component is sampled with the reference sample pulse DS1 is higher than a potential obtained when the signal component is sampled with the peak sample pulse DS2. Therefore, in the case where the potential obtained when sampled with the reference sample pulse DS1 is lower than the potential obtained when sampled with the peak sample pulse DS2, a differential thereby obtained has an opposite direction. As a result, the signal change differential value ΔSd is outputted as the zero level. In the present preferred embodiment, wherein the phase of the reference sample pulse DS1 is earlier than the phase of the peak sample pulse DS2, the signal change differential value ΔSd is outputted as the zero level for a period during which the rise of the signal waveform is shown.

As described, in the waveform of the analog imaging signal Sa, a wave-like mountain portion of the signal change differential value ΔSd is formed in the signal waveform falling portion in the reset period T1 and the signal waveform falling portion in the signal period T3. The mountain portion is hereinafter called an outstanding large differential portion A. When the voltage of the signal change differential value shows its peak in the reference period T2 and the signal period T3 or in portions showing the rise of the signal waveform in the periods T2 and T3, a stable portion where the variation of the differential waveform is small is formed. The portion is hereinafter called a stable small differential portion B.

The Step S1 is performed in order to observe the phase regions of the outstanding large differential portion A and the stable small differential portion B. Therefore, a threshold value is set for the signal change differential value ΔSd so that the phase regions of the outstanding large differential portion A and the stable small differential portion B are extracted.

Figure 7:
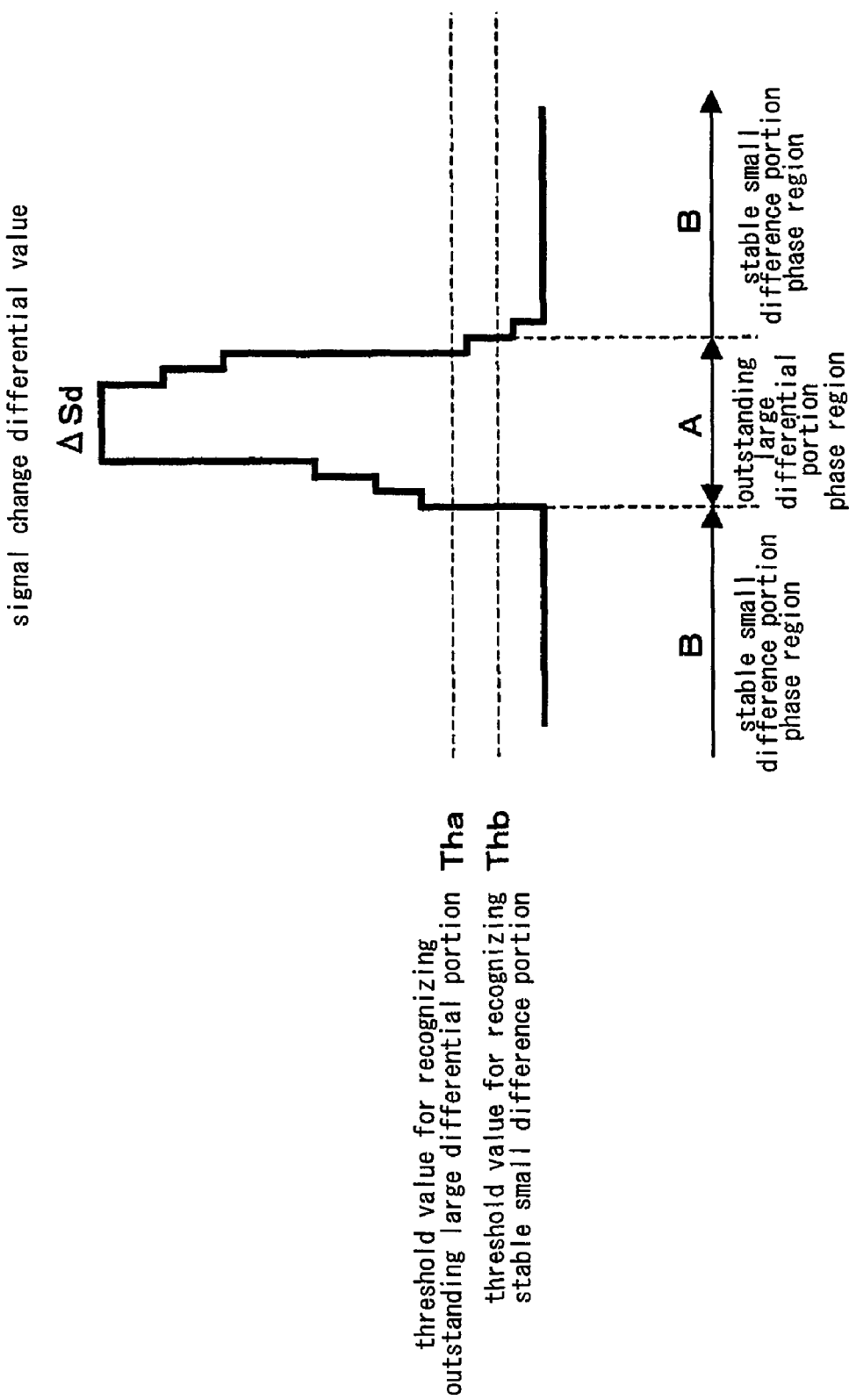
FIG. 7 is an illustration of a threshold value for recognizing an outstanding large differential portion and a threshold value for recognizing a stable small differential portion according to the preferred embodiment 1.
Figure 8:
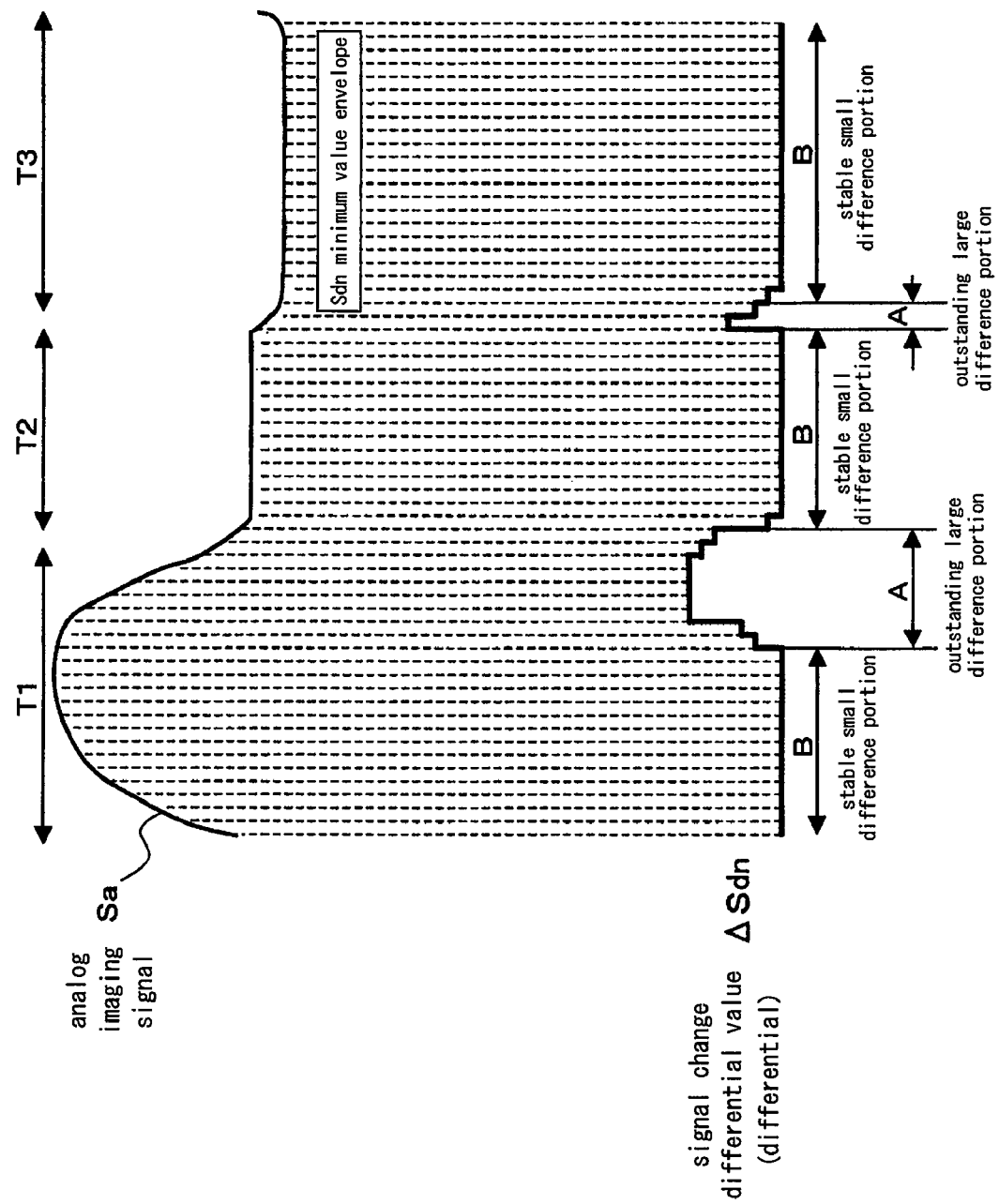
FIG. 8 shows the division of a phase region in the relationship between the chronologically-shown signal component outputted from the imaging element and the waveform of the signal change differential value in the minimum value envelope according to the preferred embodiment 1.
Figure 9:
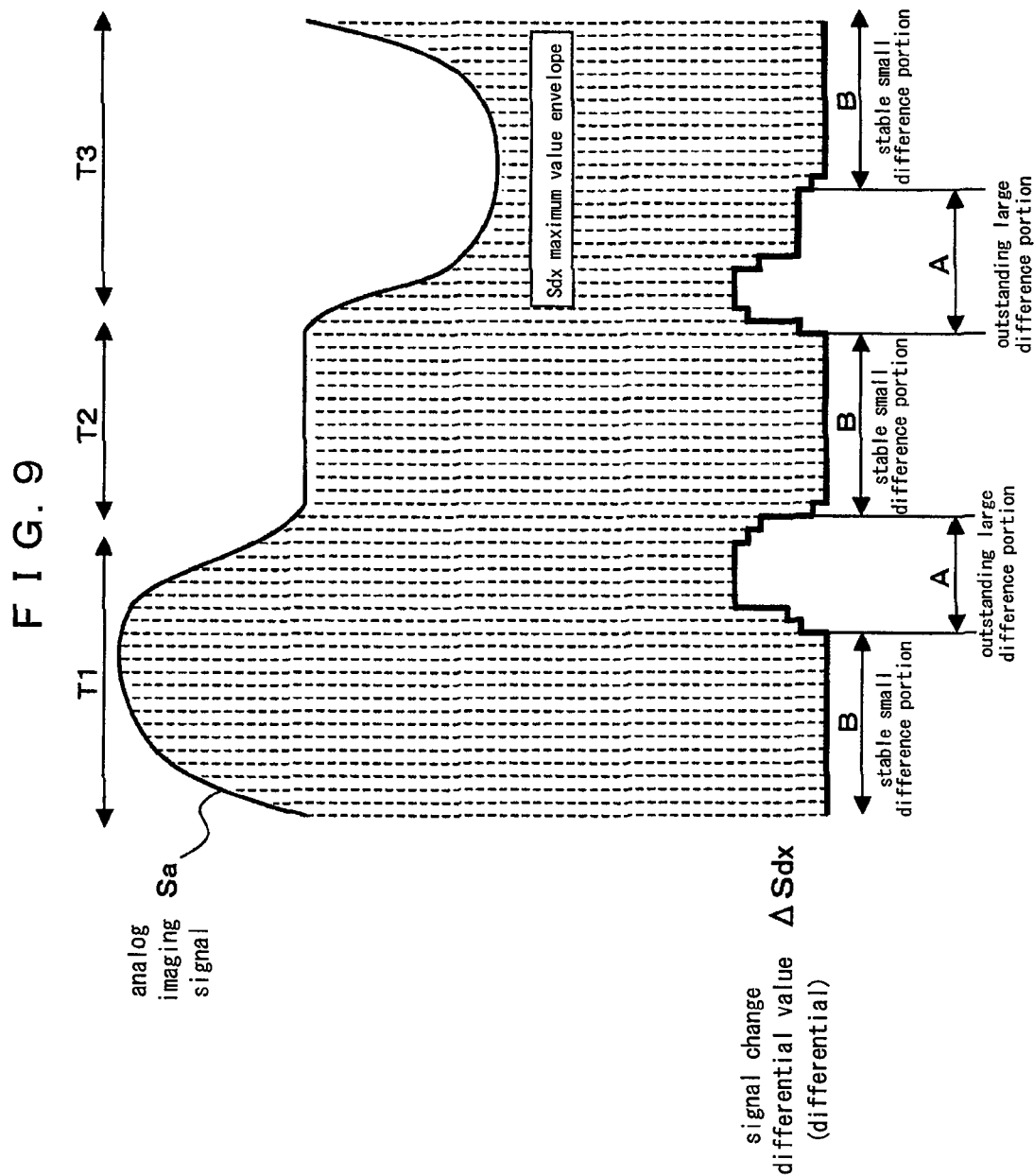
FIG. 9 shows the division of a phase region in the relationship between the chronologically-shown signal component outputted from the imaging element and the waveform of the signal change differential value in the maximum value envelope according to the preferred embodiment 1.

Next, the setting of the threshold value of the signal change differential value ΔSd is described. As shown in FIG. 7, two threshold values, which are a threshold value Tha for recognizing the outstanding large differential portion A and a threshold value Thb for recognizing the stable small differential portion B, are set. The region of the stable small differential portion B is switched to the region of the outstanding large differential portion A based on the threshold value Tha. The region of the outstanding large differential portion A is switched to the region of the stable small differential portion B based on the threshold value Thb. The judgment of the switchover between the region of the stable small differential portion B and the region of the outstanding large differential portion A has hysteresis characteristics. Accordingly, any drastic variation (excessive vibration) of the differential value generated due to noise or the like is absorbed, and the phase region of the outstanding large differential portion A is two portions, which are the signal waveform falling portion in the reset period T1 and the signal waveform falling portion in the signal period T3. FIGS. 8 and 9 show a result obtained by the foregoing observation method. In FIG. 8, the phase region of the outstanding large differential portion A and the phase region of the stable small differential portion B shown in FIG. 5 are shown in a dividing manner. In FIG. 9, the phase region of the outstanding large differential portion A and the phase region of the stable small differential portion B shown in FIG. 6 are shown in the dividing manner.

However, it is difficult, by means of the described observation method alone, to identify the outstanding large differential portion A corresponding to the signal waveform falling portion in the reset period T1 and the outstanding large differential portion A corresponding to the signal waveform falling portion in the signal period T3 in the case of a plurality of outstanding large differential portions A. Further, it is not possible to identify the stable small differential portion B corresponding to the reference period T2 and the stable small differential portion B corresponding to the time when the signal change differential value voltage shows its peak in the signal period T3 in the case of a plurality of stable small differential portions B. Therefore, the following processing is provided.

2) Step S2: Estimation of Phase Region of Signal Waveform Falling Portion in Reset Period T1

In this step, the analog imaging signal waveform estimator 13 estimates the signal waveform falling portion in the reset period T1. The signal waveform falling portion in the reset period T1 is estimated based on the signal change differential value ΔSdn in the minimum value envelope Sdn (see FIG. 8). Below is given a detailed description.

The mountain portion of the differential waveform generated in the signal change differential value ΔSdn in the minimum value envelope Sdn obviously includes a large mountain and a small mountain. Below is described a reason. The signal level over the period during which the OB pixel regions are being read is necessarily at a lowest level. However, when the signal change differential value ΔSdn in the minimum value envelope Sdn is calculated, the signal period T3 is a period in which the OB pixel region whose signal level is low is reflected. Further, the signal level in the reset period T1 is always constant irrespective of the conditions of a photographic subject and the read or non-read of the OB region. Further, the signal change differential value ΔSdn in the period T1 is larger than in any other period because the signal waveform in the reset period T1 is basically steep. Based on the aspect described above, the signal waveform falling portion in the reset period T1 is a period during which a large value of the signal change differential value ΔSdn is constantly detected, while the signal falling portion in the signal period T3 is a period during which a small value of the signal change differential value ΔSdn is constantly detected. When a signal level in the OB pixel region is far lower than expected, the signal level does not reach the threshold value Tha for recognizing the outstanding large differential portion A. Even in such a case, at least one outstanding large differential portion A is possibly present.

Based on the description above, the estimation is carried out as follows. In the case where there are two outstanding large differential portions A, the phase region of the outstanding large differential portion A in which the mountain portion is obviously high as against the phase region of the other outstanding large differential portion A is estimated as the phase region corresponding to the signal waveform falling portion in the reset period T1. In the case where there is only one outstanding large differential portion A, the phase region of the outstanding large differential portion A is estimated as the phase region corresponding to the signal waveform falling portion in the reset period T1.

3) Step 3: Estimation of Phase Region of Signal Waveform Falling Portion in Signal Period T3

In this step, the analog imaging signal waveform estimator 13 estimates the signal waveform falling portion in the signal period T3. The estimation of the phase period in the signal waveform falling portion in the signal period T3 is described referring to FIG. 9 showing the signal change differential value ΔSdx in the maximum value envelope Sdx of the analog imaging signal Sa in which the signal change between the reset period T1 and the signal period T3 is remarkably large. At a time point when the phase region in the signal waveform falling portion in the signal period T3 is estimated, the phase region of the signal waveform falling portion in the reset period T1 has already been determined. Therefore, the signal waveform falling portion in the signal period T3 is estimated as the phase region of the outstanding large differential portion A which is different to the phase region of the outstanding large differential portion A in the reset period T1. FIG. 8 is not referred to for the above description because there may not be any large differential portion A in the signal period T3.

4) Step S4: Estimation of Phase Region in Reference Period T2

In this step, the analog imaging signal waveform estimator 13 performs the estimation regarding the reference period T2. The estimation regarding the reference period T2 is performed based on the signal change differential value ΔSdx in the maximum value envelope Sdx (see FIG. 9) in a manner similar to the estimation regarding the signal period T3. Below is given a detailed description.

The reference voltage is shown in the reference period T2, in which the waveform amplitude does not exist. Therefore, in FIG. 9, the reference period T2 corresponds to the phase region of the stable small differential portion B in which the signal change differential value ΔSd is at the zero level. At the time, the phase region of the signal waveform falling portion in the reset period T1 and the phase region of the signal waveform falling portion in the signal period T3 have already been determined. Therefore, the reference period T2 corresponds to the phase region of the stable small differential portion B between the phase region of the outstanding large differential portion A (corresponding to the signal waveform falling portion in the reset period T1) and the phase region of the outstanding large differential portion A (corresponding to the signal waveform falling portion in the signal period T3).

5) Step S5: Setting of Optimal Phases of Reference Sample Pulse DS1 and Peak Sample Pulse DS2

In this step, the timing adjuster 14 adjusts the phases of the reference sample pulse DS1 and the peak sample pulse DS2. As described earlier, the reference sample pulse DS1 is desirably phase-adjusted so that the rising edge of the reference sample pulse DS1 is as coincident with the middle point of the reference period T2 as possible. Therefore, the reference sample pulse DS1 is phase-adjusted so that the rising portion of the reference sample pulse DS1 is as coincident with a middle point of the phase region in the reference period T2 estimated in the estimation of the reference period as possible. More specifically, the phase of the reference sample pulse DS1 is adjusted so that the rising edge of the reference sample pulse DS1 is as coincident with the middle point of the reference period T2 as possible.

As described earlier, the peak sample pulse DS2 is desirably phase-adjusted so that the rising edge of the peak sample pulse DS2 is as coincident with the time point when the voltage of the signal change differential value in the signal period T3 shows its peak. Therefore, the peak sample pulse DS2 is phase-adjusted so that the rising edge of the peak sample pulse DS2 is as coincident with a middle point of the phase region in the signal period T3 estimated in the estimation of the reference period as possible. More specifically, the peak sample pulse DS2 is phase-adjusted so that the rising edge of the peak sample pulse DS2 is as coincident with a border between the falling portion in the signal period T3 and the stable small differential portion B immediately thereafter as possible.

The analog imaging signal Sa at the time when the signal change differential value voltage shows its peak shows a relatively moderate waveform after the drastic fall in the signal period T3. Then, the waveform shows a drastic rise again, followed by the transition to the reset period T1.

As described earlier, the analog imaging signal Sa observed in the Step S1 is outputted based on the assumption that no differential is generated during the rise of the signal waveform. Therefore, in the waveform shown in FIG. 9, the phase region of the stable small differential portion B after the phase region of the outstanding large differential portion A showing the falling period of the signal period T3 includes a period during which the voltage of the signal change differential value shows its peak and a period during which the signal rises for the transition to the reset period T1.

Based on the fact that there is the period during which the signal change differential value voltage shows its peak after the fall in the signal period T3, the estimation of a boundary between the period during which the signal change differential value voltage shows its peak and the period during which the signal rises for the transition from the peak period to the next reset period T1 is omitted in the present preferred embodiment, so that a processing speed is increased. In place of the estimation, a boundary at which the phase region of the outstanding large differential portion A corresponding to the signal waveform falling portion in the signal period T3 switches to the phase region of the stable small differential portion B is estimated, and the peak sample pulse DS2 is phase-adjusted so that the rise of the peak sample pulse DS2 occurs at the estimated boundary.

According to the method described so far, the phase of the reference sample pulse DS1 and the phase of the peak sample pulse DS2 can be automatically adjusted. Therefore, in the case where the characteristics of the imaging element 2 are changed due to the exchange of the imaging element 2 itself or some external factors (temperature, deterioration over time and the like), the phases of the reference sample pulse DS1 and the peak sample pulse DS2 outputted from the timing generator 6 can maintain a high accuracy through the automatic adjustment.

Further, the analog imaging signal Sa is replaced with the signal change differential value ΔSd, and the waveform of the imaging signal Sa is estimated, and then, the optimal phases of the reference sample pulse DS1 and the peak sample pulse DS2 are calculated based on the estimated waveform of the analog imaging signal Sa. Therefore, the phase can be adjusted in a manner similar to such a method that adjusts the phase while observing the analog imaging signal Sa by a measuring device such as an oscilloscope. Accordingly, the phase of the pulse can be visually adjusted, which does not demand such a step that separately adjusts the respective phases of the pulses. As a result, the phase adjustment can be performed at a higher speed.

The shift of the phase of the pulse and the detection of the optimal phase in the phase adjustment, which are such simple processing, can be realized by hardware alone. As a result, the phase adjustment can be performed at even a higher speed.

Further, hardware circuits can constitute the signal change differential value detector 11, signal change differential value memory 12, analog imaging signal waveform estimator 13 and timing adjuster 14, or these components can be realized by software in a microcomputer. Other than the hardware or software constitution, it is needless to say that the present preferred embodiment described so far is merely an example, and various modifications are acceptable other than main modification examples described below.

Preferred Embodiment 2

Figure 10:
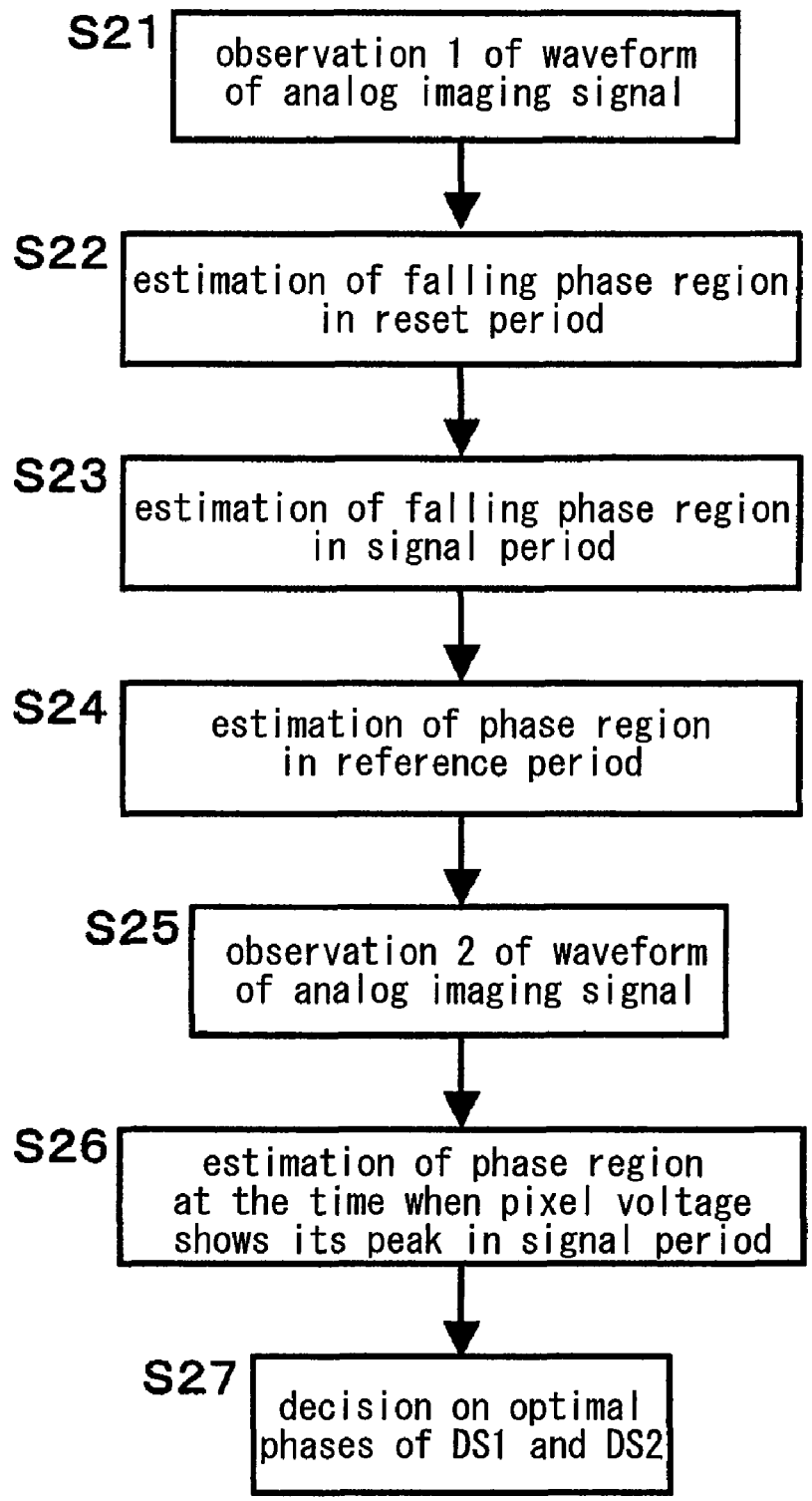
FIG. 10 is a flow chart illustrating phase adjustment operations according to a preferred embodiment 2 of the present invention.

FIG. 10 is a flow chart illustrating phase adjustment operations according to a preferred embodiment 2 of the present invention. The present preferred embodiment is characterized in that the optimal phase of the peak sample pulse DS2 is more accurately set. In the present preferred embodiment, a step of observing the analog imaging signal Sa again after the estimation of the phase region in the reference period T2 and a step of estimating the phase region when the voltage of the signal change differential value shows its peak in the signal period T3 are provided.

In the phase adjustment of the peak sample pulse DS2 according to the preferred embodiment 1, in order to increase the processing speed, the rising portion of the peak sample pulse DS2 is located at the boundary at which the phase region of the outstanding large differential portion A (corresponding to the signal waveform falling portion in the signal period T3) switches to the phase region of the stable small differential portion B when the optimal phase of the peak sample pulse DS2 is decided.

However, the sampling position of the pulse DS2 may be variable due to temperature variation of a delay adjustment cell in the peak sample pulse DS2 depending on environmental changes after the adjustment. Therefore, the pulse DS2 does not always rise when the voltage of the signal change differential value shows its peak.

In order to more accurately set the optimal phase of the pulse DS2, it is preferable for a position where the phase of the pulse DS2 is adjusted to have some allowance so that the pulse DS2 can be sampled when the signal voltage shows its peak irrespective of a certain amount of variation in the sampling position. By doing so, the rise of the peak sample pulse DS2 is coincident with the center of the waveform at the time when the signal voltage shows its peak in the case of the optimal phase set with some allowance in the phase adjustment position.

Based on the aspect described above, the phases of the reference sample pulse DS1 and the peak sample pulse DS2 are reversed timewise. More specifically, in order to calculate the phase region in the signal voltage peak period in the signal period T3 in a manner similar to the estimation of the phase region in the reference period T2, the phase of either the reference sample pulse DS1 or the peak sample pulse DS2 is shifted from the phase of the other in a state where the intervals in the reference sample pulse DS1 and the interval of the peak sample pulse are fixed in Step S25. At the time, the phase of the reference sample pulse DS1 is delayed in comparison to the phase of the peak sample pulse DS2. Then, the analog imaging signal Sa is observed so that the rise of the waveform thereof is detected. At the time, a period during which the phase is shifted is set as follows in order to increase the processing speed. The phase shift period is a period from the boundary at which the phase region of the outstanding large differential portion A (corresponding to the signal waveform falling portion in the signal period T3) switches to the phase region of the stable small differential portion B to the time point when the signal change differential value reaches the threshold value Tha for recognizing the outstanding large differential portion A.

Figure 11:
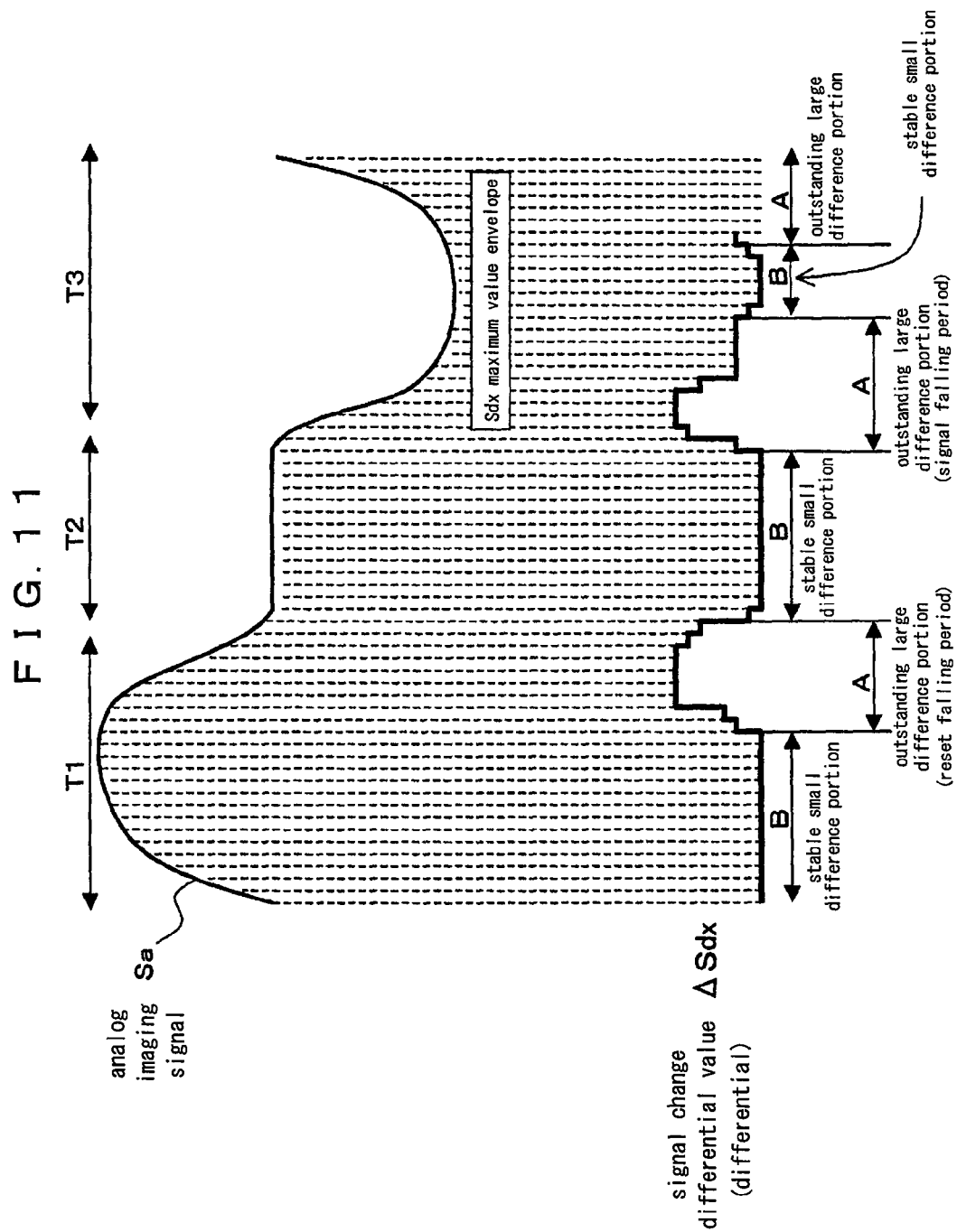
FIG. 11 shows the division of a phase region in the relationship between the chronologically-shown signal component outputted from the imaging element and the waveform of the signal change differential value in the maximum value envelope according to the preferred embodiment 2.

FIG. 11 chronologically shows the signal change differential value ΔSdx in the maximum value envelope Sdx (memorized in the signal change differential value memory 12) in comparison to the analog imaging signal (image signal) at a time point when the processing has already advanced to the Step S25. In FIG. 11, the phase region of the outstanding large differential portion A and the phase region of the stable small differential portion B are shown in the dividing manner. As is assumed from FIG. 11, the phase region of the stable small difference region B is present after the phase region of the outstanding large differential portion A (corresponding to the signal waveform falling portion in the signal period T3), and the phase region of the outstanding large differential portion A is present after the phase region of the stable small difference region B.

In Step S26, the followings are estimated based on the estimation of the phase region at the time when the voltage of the signal change differential value shows its peak in the signal period T3. It is estimated that the phase region of the stable small difference region B between the phase region of the outstanding large differential portion A (corresponding to the signal waveform falling portion in the signal period T3) and the phase region of the outstanding large differential portion A thereafter corresponds to the phase region where the voltage of the signal change differential value shows its peak in the signal period T3.

Below is described processing in Step S27. When the optimal phase of the reference sample pulse DS1 is adjusted, the phase adjustment of the reference sample pulse DS1 is performed so that the rise of the reference sample pulse DS1 falls on a central phase of the phase region in the reference period T2 determined based on the estimation of the reference period T2. When the optimal phase of the peak sample pulse DS2 is adjusted, the phase adjustment of the peak sample pulse is performed so that the rise of the peak sample pulse DS2 falls on a central phase of the phase region where the voltage of the signal change differential value shows its peak in the signal period T3. In the preferred embodiment 2 wherein the phase adjustment is thus controlled, the adjustment accuracy can be improved though the adjustment is slowed down.

Preferred Embodiment 3

In the preferred embodiment 1, the phase is adjusted every time all of the regions in the effective pixel region of the imaging element 2 and the OB pixel regions are read in the observation of the analog imaging signal Sa. However, all of the regions in the effective pixel region and the OB pixel regions are divided into a plurality of regions based on a plurality of lines, and the phase is shifted every time each of the divided regions is read. As a result, an amount of time necessary for observing the analog imaging signal Sa can be reduced.

Figure 12:
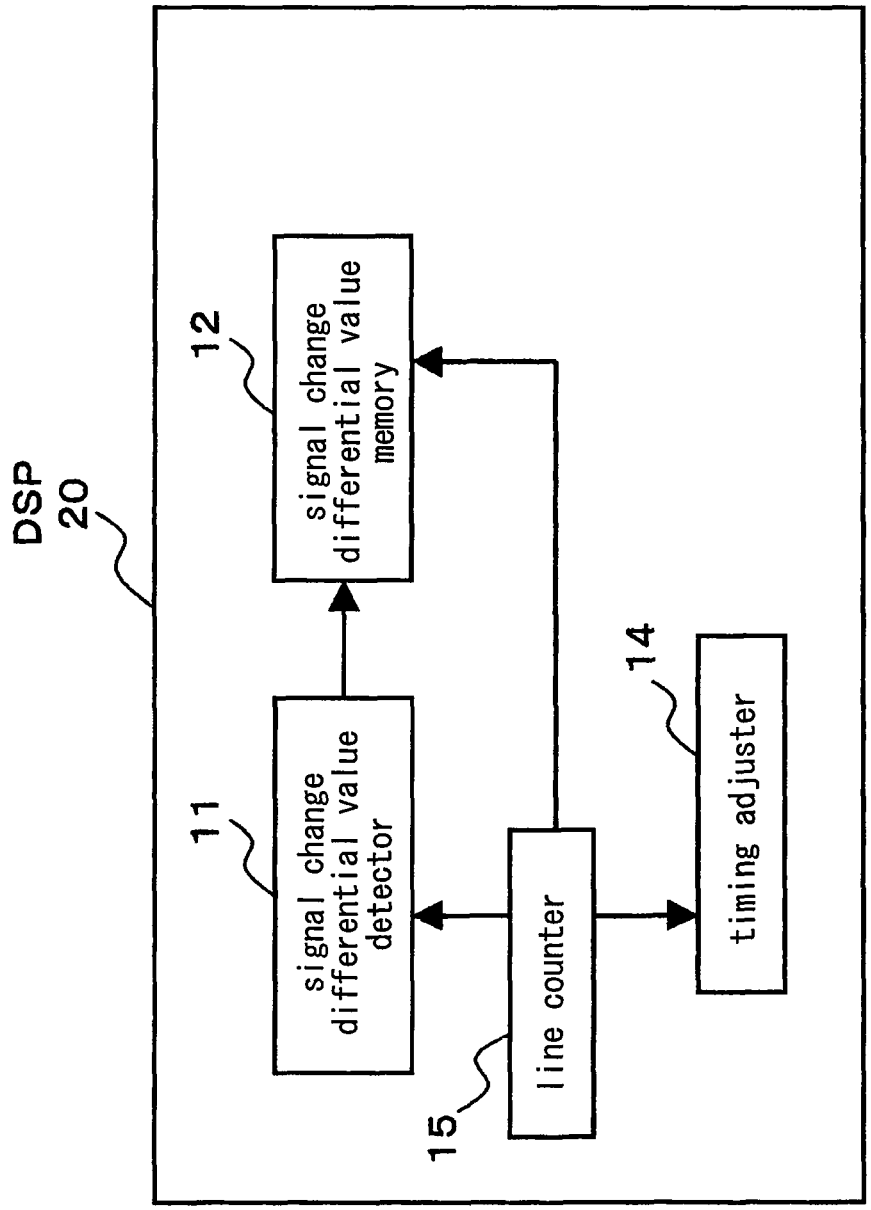
FIG. 12 is a block diagram illustrating a structure of a DSP according to a preferred embodiment 3 of the present invention.

More specifically, as shown in FIG. 12, a line counter 15 for counting the number of the lines is provided in the DSP 20. When the line counter 15 counts the number of reading lines L previously defined, the signal change differential value detector 11 receives a result of the count, and resets the signal change differential value ΔSdx in the maximum value envelope Sdx and the signal change differential value ΔSdn in the minimum value envelope Sdn. The signal change differential value memory 12 which received the counting result memorizes the signal change differential value ΔSdx and the signal change differential value ΔSdn. The timing adjuster 14 which received the counting result shifts the phases of the next reference sample pulse DS1 and peak sample pulse DS2. Then, the acquisition of the waveform information in the next phase starts.

Accordingly, the time amount for observing the analog imaging signal Sa is reduced, which consequently reduces the phase adjustment time. The two sampling pulses used for the phase adjustment are typically the combination of the reference sample pulse DS1 and the peak sample pulse DS2; however, are not necessarily limited thereto.

The preferred embodiments described so far are merely examples, and it is needles to say the various modifications are possible within the intended scope of the present invention.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A phase adjustment device for adjusting a phase of an imaging pulse used for imaging an analog imaging signal outputted by an imaging element based on a digital imaging signal obtained when the analog imaging signal is converted into a digital value for each pixel of the imaging element, comprising:

a signal change differential value detector for detecting a signal change differential value between two digital signals obtained when the analog imaging signal is converted into the digital value for each pixel using two phase adjustment sampling pulses;

an analog imaging signal waveform estimator for estimating a waveform of the analog imaging signal based on the signal change differential value; and a timing adjuster for calculating an optimal phase of the imaging pulse based on the waveform of the analog imaging signal estimated by the analog imaging signal waveform estimator.

2. The phase adjustment device as claimed in claim 1, further comprising a signal change different value memory for memorizing the signal change differential value for each pixel detected by the signal change differential value detector, wherein the analog imaging signal waveform estimator reads the signal change differential value from the signal change differential value memory and estimates the waveform of the analog imaging signal.

3. The phase adjustment device as claimed in claim 1, wherein the timing adjuster calculates the optimal phase while shifting sampling phases of the two phase adjustment sampling pulses in a state where phase intervals in the two phase adjustment sampling pulses are fixed.

4. The phase adjustment device as claimed in claim 1, wherein the timing adjuster uses the two imaging pulses as the phase adjustment sampling pulses and uses the two imaging pulses in a state where these pulses are phase-shifted.

5. The phase adjustment device as claimed in claim 4, wherein the two imaging pulses used as the phase adjustment sampling pulses by the timing adjuster are a peak sample pulse for detecting a level of the analog imaging signal and a reference sample pulse for detecting a signal level used as a reference level when the analog imaging signal is subjected to the correlated double sampling.

6. The phase adjustment device as claimed in claim 1, wherein the signal change differential value detector continuously shifts the phases of the phase adjustment sampling pulses, and detects a first signal change differential value in a maximum value envelope of the analog imaging signal and a second signal change differential value in a minimum value envelope of the analog imaging signal for each of the shifted phases.

7. The phase adjustment device as claimed in claim 6, wherein the analog imaging signal waveform estimator estimates a first falling portion in a reset period of the analog imaging signal, a reference period portion of the analog imaging signal and a second falling portion in a signal period of the analog imaging signal based on the first and second signal change differential values.

8. The phase adjustment device as claimed in claim 1, wherein the signal change differential value detector detects the signal change differential value using an analog imaging signal including an analog imaging signal obtained from an OB region as the analog imaging signal.

9. The phase adjustment device as claimed in claim 6, wherein the analog imaging signal waveform estimator extracts from a first distribution region of the first signal change differential value for each phase a first outstanding large differential portion whose a value is larger than in other portions in the first distribution region and a first stable small differential portion whose value is smaller than in other portions in the first distribution region, the analog imaging signal waveform estimator further extracting from a second distribution region of the second signal change differential value for each phase a second outstanding large differential portion whose a value is larger than in other sections in the second distribution region and a second stable small differential portion whose value is smaller than in other sections in the second distribution region, and the analog imaging signal waveform estimator estimates that the first and second outstanding large differential portions are the falling phase region in the reset period of the analog imaging signal and the falling phase region in the signal period of the analog imaging signal, and estimates that the first and second stable small differential portions are the phase region in the reference period of the analog imaging signal.

10. The phase adjustment device as claimed in claim 9, wherein the analog imaging signal waveform estimator sets, as threshold values for extracting the first and second outstanding large differential portions and the first and second stable small differential portions, a first threshold value for distinguishing the first and second outstanding large differential portions from the other sections in the first and second distribution regions in which the value is smaller than in the first and second outstanding large differential portions and a second threshold value, being smaller than the first threshold value, for distinguishing the first and second stable small differential portions from the other sections in the first and second distribution regions in which the value is larger than in the first and second stable small differential portions so that criteria for extracting the first and second outstanding large differential portions and the first and second stable small differential portions can have hysteresis characteristics.

11. The phase adjustment device as claimed in claim 7, wherein the analog imaging signal waveform estimator further estimates a rising portion in the signal period by reversing the phases of the phase adjustment sampling pulses timewise, and the timing adjuster calculates the optimal phase based on the second falling portion and the rising portion.

12. The phase adjustment device as claimed in claim 1, further comprising a line counter, wherein the line counter gives an instruction on a target of the detection of the signal change differential value to the signal change differential value detector in units of a plurality of lines.

13. A digital camera comprising:

an imaging element for outputting an analog imaging signal;

a correlated double sampling unit for executing correlated double sampling to the analog imaging signal and deciding a signal level of the imaging element for each pixel;

an automatic gain controller for adjusting an amplitude of the analog imaging signal of which the signal level for each pixel is decided by the correlated double sampling unit;

an AD converter for generating a digital imaging signal from the analog imaging signal of which the signal level for each pixel is decided by the correlated double sampling unit and the amplitude is adjusted by the automatic gain controller;

a timing generator for generating an imaging pulse used for imaging the analog imaging signal; and the phase adjustment device as claimed in claim 1 for adjusting a phase of the imaging pulse based on the digital imaging signal.

14. A phase adjustment method for adjusting a phase of a peak sample pulse for detecting a peak signal level of an analog imaging signal outputted from an imaging element and a phase of a reference sample pulse for detecting a signal level used as a reference level for executing correlated double sampling to the analog imaging signal, including:

a step of obtaining a digital imaging signal by sampling the analog imaging signal for each pixel of the imaging element while shifting sampling phases of the peak sample pulse and the reference sample pulse are in a state where phase intervals in the respective pulses are fixed;

a step of calculating a signal change differential value of the digital imaging signal;

a step of extracting a phase region where the signal change differential value is smaller than in other sections in a phase of the digital imaging signal and a phase region where the signal change differential value is larger than in the other sections in the phase;

a step of estimating a waveform of the analog imaging signal based on a result of the extraction in the extracting step; and a step of setting an optimal phase of the peak sample pulse and an optimal phase of the reference sample pulse based on the estimated waveform of the analog imaging signal.

15. A phase adjustment method for adjusting a phase of a peak sample pulse for detecting a peak signal level of an analog imaging signal outputted from an imaging element and a phase of a reference sample pulse for detecting a signal level used as a reference level for executing correlated double sampling to the analog imaging signal, including:

a step of obtaining a digital imaging signal by sampling the analog imaging signal for each pixel of the imaging element while shifting sampling phases of the peak sample pulse and the reference sample pulse are in a state where phase intervals in the respective pulses are fixed;

a step of calculating a signal change differential value of the digital imaging signal;

a step of calculating a maximum value envelope of the signal change differential value and a minimum value envelope of the signal change differential value every time when the phase changes;

a step of extracting from a first distribution region of the signal change differential value in the maximum value envelope a first outstanding large differential portion whose value is larger than in other portions in the first distribution region and a first stable small differential portion whose value is smaller than in the other portions in the first distribution region, the analog imaging signal waveform estimator further extracting a second distribution region of the signal change differential value in the minimum value envelope a second outstanding large differential portion whose value is larger than in other sections in the second distribution region and a second stable small differential portion whose value is smaller than in the other sections in the second distribution region;

a step of estimating a first falling portion in a reset period of the analog imaging signal based on the first and second outstanding large differential portions;

a step of estimating a second falling portion in a signal period of the analog imaging signal based on the first and second outstanding large differential portions other than the first falling portion;

a step of estimating the first and second stable small differential portions present between the first and second falling portions in a reference period of the analog imaging signal;

a step of adjusting the phase of the reference sample pulse so that a rising edge of the reference sample pulse is as coincident with a middle point of the reference period as possible; and a step of adjusting the phase of the peak sample pulse so that a rising edge of the peak sample pulse is as coincident with a boundary between the second falling portion and the first and second stable small differential portions positioned immediately thereafter as possible.

16. A phase adjustment method for adjusting a phase of a peak sample pulse for detecting a peak signal level of an analog imaging signal outputted from an imaging element and a phase of a reference sample pulse for detecting a signal level used as a reference level for executing correlated double sampling to the analog imaging signal, including:

a step of obtaining a first digital imaging signal by sampling the analog imaging signal for each pixel of the imaging element while shifting sampling phases of the peak sample pulse and the reference sample pulse in a state where phase intervals in the respective pulses are fixed;

a step of calculating a first signal change differential value of the first digital imaging signal;

a step of calculating a first maximum value envelope of the first signal change differential value and a first minimum value envelope of the first signal change differential value every time when the phase changes;

a step of extracting from a first distribution region of the first signal change differential value in the first maximum value envelope a first outstanding large differential portion whose value is larger than in other portions in the first distribution region and a first stable small differential portion whose value is smaller than in the other portions in the first distribution region, the analog imaging signal waveform estimator further extracting from a second distribution region of the first signal change differential value in the first minimum value envelope a second outstanding large differential portion whose value is larger than in other sections in the second distribution region and a second stable small differential portion whose value is smaller than in the other sections in the second distribution region a step of estimating a first falling portion in the reset period of the analog imaging signal based on the first and second outstanding large differential portions;

a step of estimating a second falling portion in the signal period of the analog imaging signal based on the first and second outstanding large differential portions other than the first falling portion;

a step of estimating the first stable small differential portion positioned between the first and second falling portions in the reference period of the analog imaging signal;

a step of obtaining a second digital imaging signal by sampling the analog imaging signal for each pixel of the imaging element while shifting sampling phases of the peak sample pulse and the reference sample pulse are in a state where the relationship between the phases of the peak sample pulse and the reference sample pulse is reversed timewise and phase intervals in the respective pulses are then fixed;

a step of calculating a second signal change differential value of the second digital imaging signal;

a step of calculating a second maximum value envelope of the second signal change differential value;

a step of extracting from a third distribution region of the second signal change differential value a third outstanding large differential portion whose value is larger than in other sections of the third distribution region and a third stable small differential portion whose value is smaller than in the other sections of the third distribution region;

a step of estimating the third stable small differential portion positioned between the third outstanding large differential portion and the third outstanding large differential portion subsequent thereto in a period during which a pixel voltage shows its peak in the signal period;

a step of adjusting the phase of the reference sample pulse so that a rising edge of the reference sample pulse is as coincident with a middle point of the reference period as possible; and a step of adjusting the phase of the peak sample pulse so that a rising edge of the peak sample pulse is as coincident with a middle point of the pixel voltage peak period as possible.

* * * * *